(12) United States Patent
Park et al.

(10) Patent No.: US 11,889,718 B2
(45) Date of Patent: Jan. 30, 2024

(54) DISPLAY PANEL INCLUDING FUNCTIONAL LAYER

(71) Applicant: Samsung Display Co., Ltd., Yongin-Si (KR)

(72) Inventors: Eung Seok Park, Seoul (KR);
Yongtack Kim, Yongin-si (KR);
Yoonhyeung Cho, Yongin-si (KR);
Myungchul Yeo, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 284 days.

(21) Appl. No.: 17/234,971

(22) Filed: Apr. 20, 2021

(65) Prior Publication Data
US 2022/0020965 A1 Jan. 20, 2022

(30) Foreign Application Priority Data
Jul. 14, 2020 (KR) .................. 10-2020-0087048

(51) Int. Cl.
*H10K 50/84* (2023.01)
*H10K 50/85* (2023.01)
(Continued)

(52) U.S. Cl.
CPC ......... *H10K 50/856* (2023.02); *H10K 50/844* (2023.02); *H10K 59/38* (2023.02);
(Continued)

(58) Field of Classification Search
CPC .. H10K 50/856; H10K 50/844; H10K 50/858; H10K 50/865; H10K 50/85;
(Continued)

(56) References Cited

U.S. PATENT DOCUMENTS 10,048,530 B1 * 8/2018 Kim .................. G02F 1/133512
2017/0104045 A1 4/2017 Hanamura et al.
(Continued)

FOREIGN PATENT DOCUMENTS

EP  3 637 471   4/2020
KR  10-2018-0090421  8/2018
(Continued)

*Primary Examiner* — Ida M Soward
(74) *Attorney, Agent, or Firm* — F. Chau & Associates, LLC

(57) ABSTRACT

A display panel including a base layer; a circuit layer; an emission layer including first, second and third emission areas respectively corresponding to first, second and third pixel areas; an organic encapsulation layer having a flat top surface; an inorganic encapsulation layer on the top surface of the organic encapsulation layer and having a first refractive index; a functional layer disposed on the inorganic encapsulation aver and having a second refractive index less than the first refractive index; and a partition wall disposed on the functional layer and including first, second and third openings, wherein the first, second and third openings respectively correspond to the first, second and third pixel areas, wherein a total reflection critical angle between the inorganic encapsulation layer and the functional layer is less than a reference incident angle of reference light traveling from the first emission area toward the partition wall.

20 Claims, 12 Drawing Sheets

(51) Int. Cl.
*H10K 59/12* (2023.01)
*H10K 59/13* (2023.01)
*H10K 59/35* (2023.01)
*H10K 59/38* (2023.01)
*H10K 50/856* (2023.01)
*H10K 50/844* (2023.01)
*G02F 1/1362* (2006.01)
*H10K 50/17* (2023.01)
*H10K 59/126* (2023.01)
*H10K 50/15* (2023.01)
*G02F 1/1335* (2006.01)
*H10K 59/127* (2023.01)
*H10K 50/16* (2023.01)

(52) U.S. Cl.
CPC .. *G02F 1/133509* (2013.01); *G02F 1/133512* (2013.01); *G02F 1/133514* (2013.01); *G02F 1/136209* (2013.01); *G09G 2300/0408* (2013.01); *H10K 50/15* (2023.02); *H10K 50/16* (2023.02); *H10K 50/17* (2023.02); *H10K 50/171* (2023.02); *H10K 59/126* (2023.02); *H10K 59/127* (2023.02)

(58) Field of Classification Search
CPC ........ H10K 50/86; H10K 50/84; H10K 50/15; H10K 50/16; H10K 50/17; H10K 50/171; H10K 59/38; H10K 59/12; H10K 59/133; H10K 59/131; H10K 59/35; H10K 59/126; H10K 59/127; G02F 1/133509; G02F 1/133514; G02F 1/136209; G02F 1/133512; G09G 2300/0408
See application file for complete search history.

(56) References Cited

U.S. PATENT DOCUMENTS

| | | | | |
|---|---|---|---|---|
| 2018/0202616 | A1* | 7/2018 | Yoon | G02F 1/133606 |
| 2019/0137815 | A1* | 5/2019 | Kim | G02F 1/133514 |
| 2019/0155094 | A1* | 5/2019 | Kim | G02F 1/1368 |
| 2019/0155110 | A1* | 5/2019 | Lim | C09K 19/56 |
| 2019/0179065 | A1* | 6/2019 | Kim | G02B 5/223 |
| 2020/0006437 | A1 | 1/2020 | Kim et al. | |
| 2020/0073169 | A1* | 3/2020 | Jung | G02F 1/133514 |
| 2020/0091464 | A1* | 3/2020 | Park | H10K 59/32 |
| 2020/0185638 | A1* | 6/2020 | Choi | H10K 50/824 |
| 2020/0212113 | A1* | 7/2020 | Song | H10K 59/122 |
| 2020/0227485 | A1* | 7/2020 | Park | H10K 50/858 |
| 2020/0301197 | A1* | 9/2020 | Kim | G02F 1/133514 |
| 2020/0328383 | A1 | 10/2020 | Song | |
| 2020/0343315 | A1* | 10/2020 | Lin | H10K 59/126 |
| 2020/0388663 | A1* | 12/2020 | Lee | H10K 50/856 |
| 2021/0028327 | A1* | 1/2021 | Lin | H10K 59/38 |
| 2021/0091324 | A1* | 3/2021 | Jung | H05B 33/14 |
| 2021/0191199 | A1* | 6/2021 | Kim | G02F 1/133514 |

FOREIGN PATENT DOCUMENTS

| | | |
|---|---|---|
| KR | 10-2020-0003330 | 1/2020 |
| KR | 10-2020-0088923 | 7/2020 |
| WO | 2014104766 | 7/2014 |

* cited by examiner

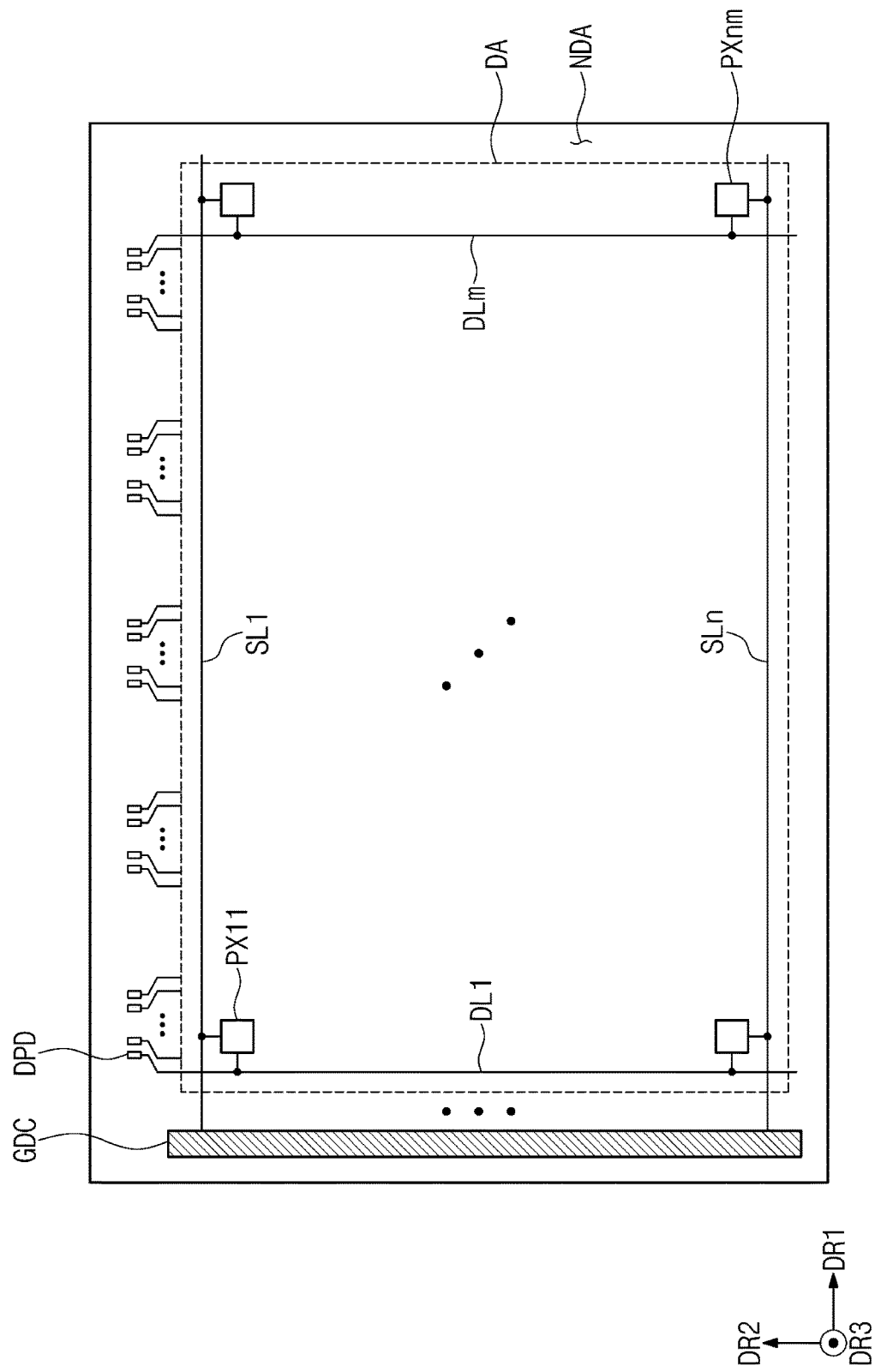

FIG. 4C
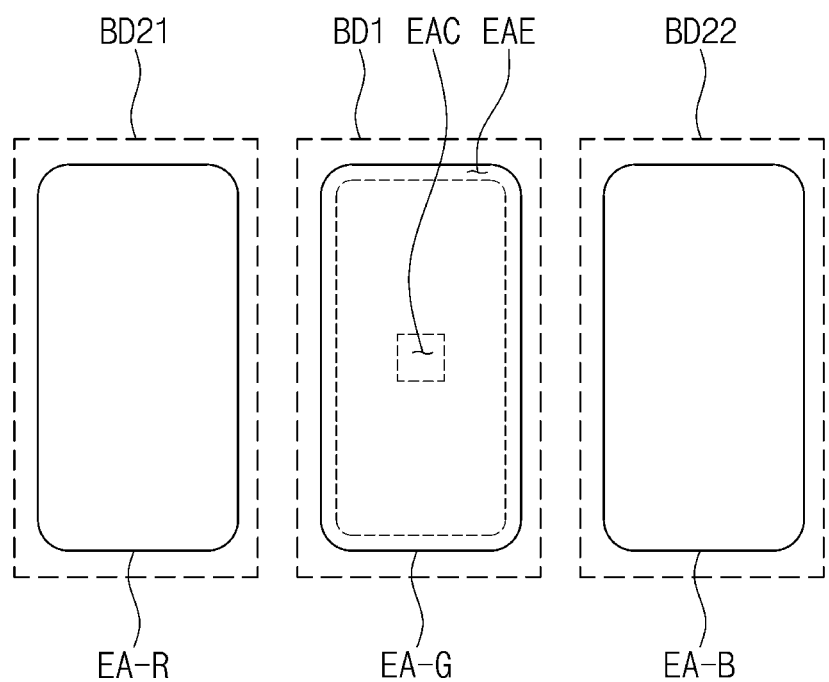
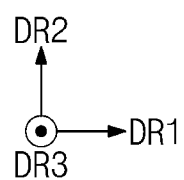

FIG. 9A
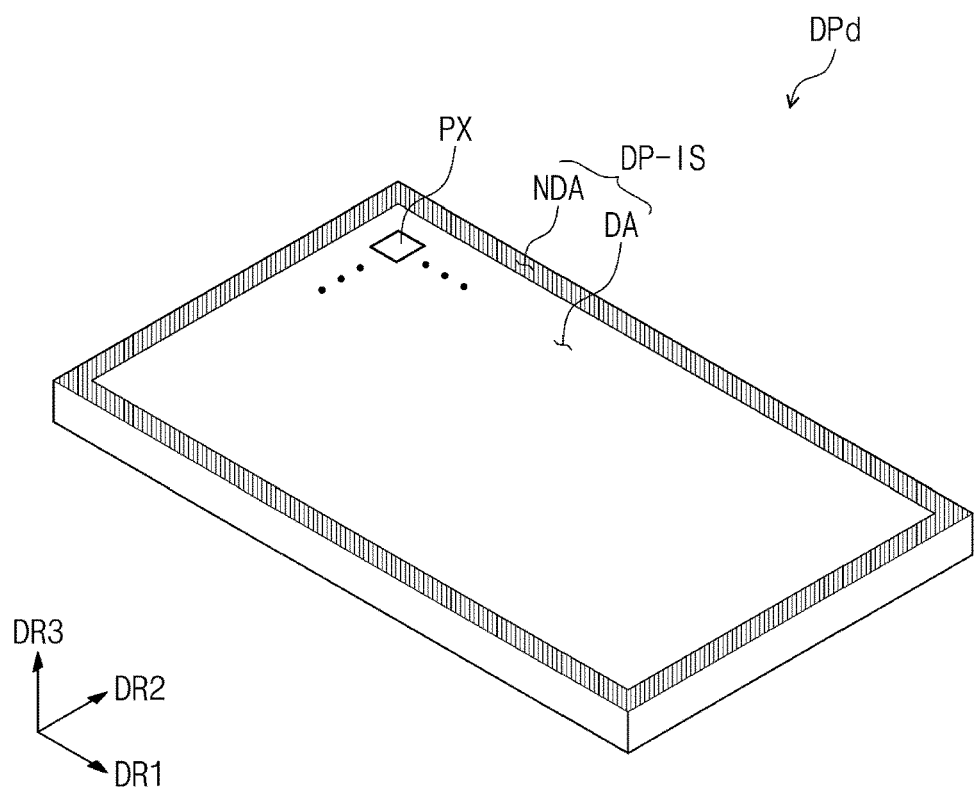
FIG. 9B
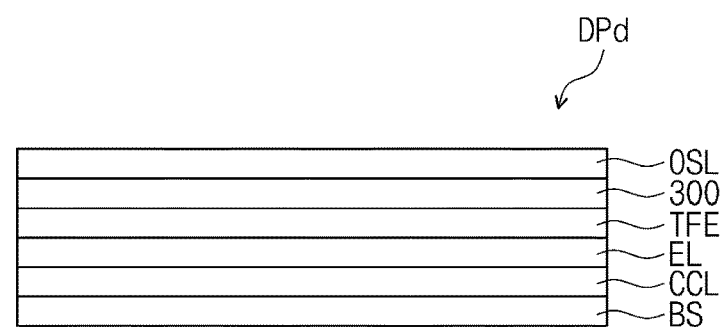
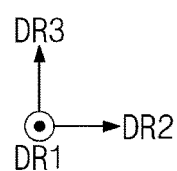

DISPLAY PANEL INCLUDING FUNCTIONAL LAYER

CROSS-REFERENCE TO RELATED APPLICATION

This U.S. non-provisional patent application claims priority under 35 U.S.C. § 119 to Korean Patent Application No. 10-2020-0087048, filed on Jul. 14, 2020, the disclosure of which is incorporated by reference herein in its entirety.

TECHNICAL FIELD

The present inventive concept relates to a display panel having high display quality.

DISCUSSION OF RELATED ART

A display device is an output device for the presentation of information through a display panel. The display panel may be a transmissive display panel or an emissive display panel. The transmissive display panel selectively transmits source light generated from a light source, while the emissive display panel generates source light from the display panel itself. The display panel may include different kinds of light control patterns depending on an arrangement of pixels to generate a color image. A light control pattern may transmit only a portion of the source light within a particular wavelength range or may convert a color of the source light. In addition, a portion of the light control pattern may not convert the color of the source light bur convert characteristics of the source light.

SUMMARY

An embodiment of the inventive concept provides a display panel including: a first pixel area, a second pixel area, a third pixel area, and a peripheral area that is adjacent to the first, second and third pixel areas; a base layer; a circuit layer disposed on the base layer; an emission layer disposed on the circuit layer and including a first emission area, a second emission area, and a third emission area, wherein each of the first, second and third emission areas generates source light, and wherein the first, second and third emission areas respectively correspond to the first pixel area, the second pixel area, and the third pixel area, an organic encapsulation layer disposed on the emission layer, wherein a top surface of the organic encapsulation layer is flat; an inorganic encapsulation layer disposed on the top surface of the organic encapsulation layer and having a first refractive index; a functional layer disposed on the inorganic encapsulation layer and having a second refractive index less than the first refractive index; and a partition wall disposed on the functional layer and including a first opening, a second opening, and a third opening, wherein the first, second and third openings respectively correspond to the first pixel area, the second pixel area, and the third pixel area, wherein a total reflection critical angle between the inorganic encapsulation layer and the functional layer is less than a reference incident angle of reference light traveling from the first emission area toward the partition wall.

The reference light may be light incident from the first emission area toward a boundary between a first side surface of the partition wall along the first opening and a bottom surface of the partition w all connected to the first side surface.

The reference light may be light incident from an outer portion of the first emission area or a central portion of the first emission area toward the boundary.

The reference light may be light incident from the first emission area toward a boundary between a second side surface of the partition wall along the second opening and a bottom surface of the partition wall connected to die second side surface.

The functional layer may have a thickness of about 20 angstroms or more.

The display panel may further include: a first light conversion pattern disposed inside the first opening to convert the source light into first color light; a second light conversion pattern disposed inside the second opening to convert the source light into second color light; and an optical pattern disposed inside the third opening, wherein the source light passes through the optical pattern.

The display panel may further include a filling layer which is disposed between the functional layer and the partition wall and including a first surface and a second surface opposite to the first surface, wherein the first surface is in contact with the functional layer and is flat and the second surface is uneven.

The display panel may further include: a first color filter disposed on the first light conversion pattern to pass the first color light there through; a second color filter disposed on the second light conversion pattern to pass the second color light there through; a third color filter disposed the optical pattern to pass the source light there through; and a cover layer disposed on the first color filter, the second color filter, and the third color filter.

The display panel may further include: a first pixel electrode corresponding to the first pixel area; a second pixel electrode corresponding to the second pixel area, and a third pixel electrode corresponding to the third pixel area, wherein the first emission area is a portion of the emission layer overlapping the first pixel electrode, the second emission area is a portion of the emission layer overlapping the second pixel electrode, and the third emission area is a portion of the emission layer overlapping the third pixel electrode.

The partition wall may include a light blocking material.

The partition wall may include a first sub partition wall disposed on the functional layer and a second sub partition w all disposed on the first sub partition wall.

Each of the first opening, the second opening, and the third opening may include a first opening portion defined by the first sub partition wall and a second opening portion defined by the second sub partition wall, and wherein the first opening portion may have a width greater than that of the second opening portion.

The reference light may be light incident from the first emission area toward a boundary between a first side surface defining the first opening portion of the first sub partition wall and a bottom surface of the first sub partition wall connected to the first side surface.

When viewed in a thickness direction of the display panel, the boundary may surround one of the first emission area, the second emission area, and the third emission area.

The reference incident angle may be given by following equation:

$$\tan^{-1}\left(\frac{DT2}{DT1}\right).$$

where the DT1 is a distance between the emission layer and live functional layer, and the DT2 is a distance between a first point, at which the reference light is emitted, inside the first emission area and a second point of the functional layer to which the reference light is incident, when viewed in a thickness direction of the display panel, wherein the first refractive index ($n_1$) and the second refractive index ($n_2$) may satisfy the following equation:

$$\sin^{-1}\left(\frac{n_2}{n_1}\right) < \tan^{-1}\left(\frac{DT2}{DT1}\right).$$

An embodiment of the inventive concept provides a display panel including: a display substrate including a display area, a nor-display area, a flat top surface overlapping the display area and an emission layer configured to provide source light, a functional layer having a second refractive index less than a first refractive index of an uppermost layer of the display layer forming the flat top surface; a first light conversion pattern disposed on the functional layer to convert the source light into first color light; a second light conversion pattern disposed on the functional layer to convert the source light into second color light, and an optical pattern disposed on the functional layer to transmit the source light there through, wherein a total reflection critical angle between the uppermost layer and the functional layer is less titan a reference incident angle of reference light that travels from an area of the emission layer overlapping the first light conversion pattern toward the second light conversion pattern or the optical pattern.

Each of top and bottom surfaces of the functional layer overlapping the display area may be flat, and the functional layer may have a thickness of about 20 angstroms or more.

The display panel may further include a filling layer disposed on the functional layer and including a first surface contacting the functional layer and a second surface opposite to the first surface, wherein the first surface is flat, and the second surface is uneven.

The display panel may further include a partition disposed on the functional layer, the partition including a first opening surrounding the first light conversion pattern, a second opening surrounding the second light conversion pattern, and a third opening surrounding the optical pattern.

The reference light may be light incident front the area of the emission layer toward a boundary between a first side surface of the partition configured to define the first opening and a bottom surface of the partition connected to the first side surface, and the reference incident angle may be given by the following equation:

$$\tan^{-1}\left(\frac{DT2}{DT1}\right),$$

where the DT1 is a distance between the emission layer and the functional layer, and the DT2 is a distance between a first point, at which the reference light is emitted, inside the first emission area and a second point of the functional layer to which the reference light is incident, when viewed in a thickness direction of the display panel, wherein the first refractive index ($n_1$) and the second refractive index ($n_2$) may satisfy the following equation:

$$\sin^{-1}\left(\frac{n_2}{n_1}\right) < \tan^{-1}\left(\frac{DT2}{DT1}\right).$$

An embodiment of the inventive concept provides a display panel including: an organic encapsulation layer disposed on an emission layer and having a flat top surface; an inorganic encapsulation layer disposed on the top surface of the organic encapsulation layer and having a first refractive index; a functional layer disposed on the inorganic encapsulation layer and having a second refractive index less than the first refractive index; and a partition disposed on the functional layer and including a first opening, a second opening, and a third opening, wherein the first, second and third openings respectively correspond to a first pixel area, a second pixel area, and a third pixel area, wherein a critical angle between the inorganic encapsulation layer and the functional layer is less than a first incident angle of first light traveling from an emission area overlapped by the first opening toward the partition.

The first light traveling from the emission area toward the partition may be emitted from an edge portion of the emission area.

Te critical angle between the inorganic encapsulation layer and the functional layer may be less than a second incident angle of second light traveling from the emission area overlapped by the first opening toward the partition.

The second light traveling from the emission area toward the partition may be emitted from a central portion of the emission area.

BRIEF DESCRIPTION OF THE FIGURES

The above and other features of the inventive concept will become more apparent by describing in detail embodiments thereof with reference to the accompanying drawings. In the drawings:

FIG. 2 is a plan view of the display panel according to an embodiment of the inventive concept;

FIG. 4C is a schematic plan view illustrating a portion of FIG. 4B;

FIG. 9A is a perspective view of a display panel according to an embodiment of the inventive concept;

FIG. 9B is a cross-sectional view of the display panel according to an embodiment of the inventive concept.

DETAILED DESCRIPTION OF THE EMBODIMENTS

Figure 1A:
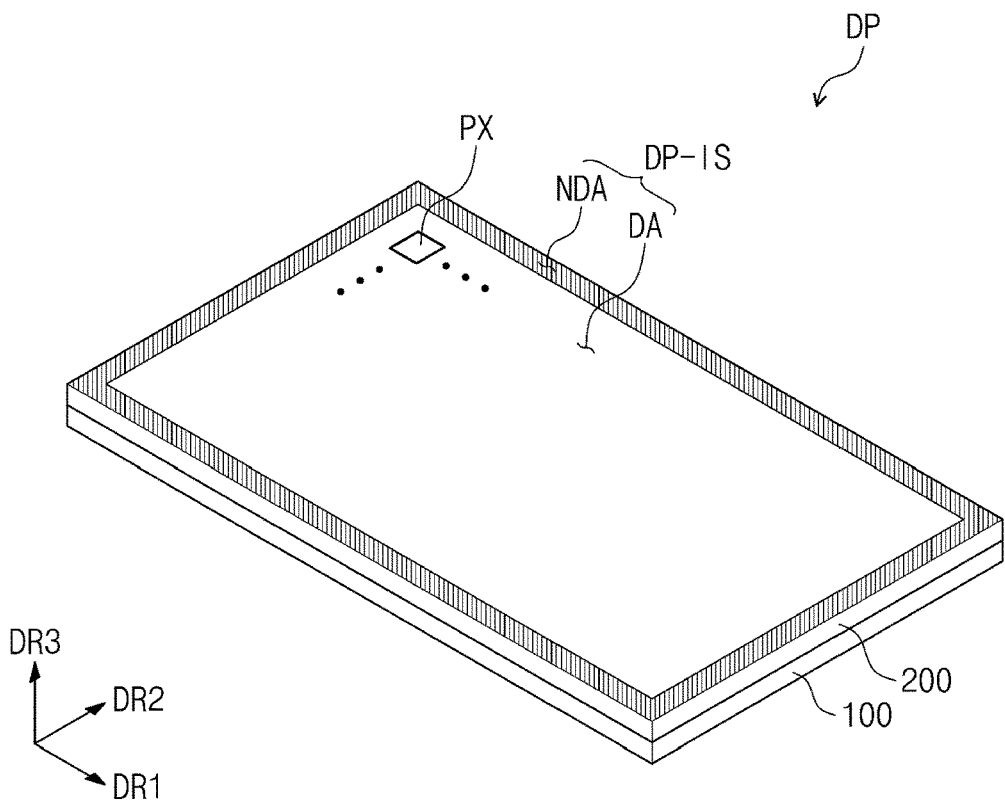
FIG. 1A is a perspective view of a display panel according to an embodiment of the inventive concept.

The present inventive concept may be variously modified and have various forms, and specific embodiments will be illustrated in drawings and described in detail in the description. However, this does not limit the present inventive concept within specific embodiments and it should be understood that the present inventive concept covers all the modifications, equivalents, and replacements within the spirit and technical scope of the inventive concept.

In this specification, it will be understood that when one component (or a region, a layer, portion, etc.) is referred to as being "on", "connected to", or "coupled to" another component, it can be directly on, connected to or coupled to the other component, or an intervening third component may be present.

Like reference numerals may refer to like elements throughout this disclosure. In addition, in the figures, the thickness, ratio, and dimensions of components may be exaggerated for clarity of illustration.

It will be understood that the terms of a singular form may include plural forms unless otherwise indicated.

In addition, terms such as "under", "below", "above", "upper", and the like may be used for explaining the relationship between components illustrated in the drawings. The terms may be a relative concept and described based on directions expressed in the drawings.

Hereinafter, embodiments of the inventive concept will be described with reference to the accompanying drawings.

Figure 1B:
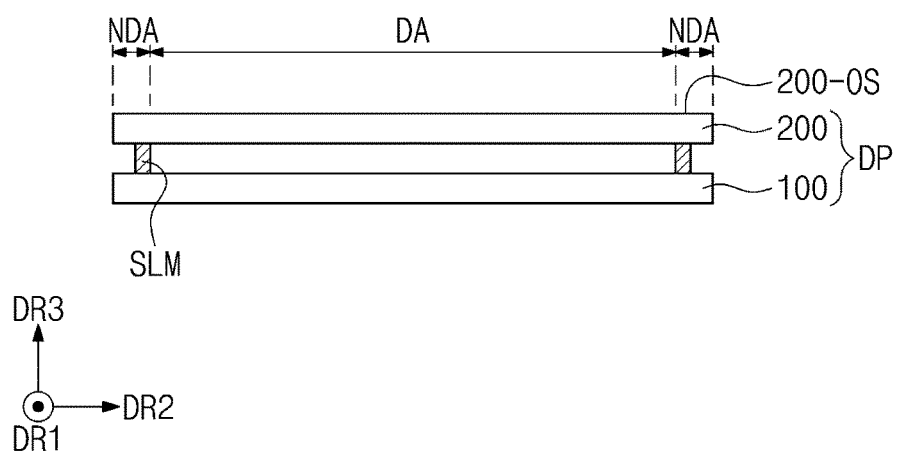
FIG. 1B is a cross-sectional view of the display panel according to an embodiment of the inventive concept.

FIG. 1A is a perspective view of a display panel DP according to an embodiment of the inventive concept. FIG. 1B is a cross-sectional view of the display panel DP according to an embodiment of the inventive concept. FIG. 2 is a plan view of the display panel DP according to an embodiment of the inventive concept.

Referring to FIGS. 1A, 1B, and 2, the display panel DP may be configured to generate an image, but it is not limited thereto. The display panel DP may be an emissive display panel. For example, the display panel DP may be an organic light emitting display panel, a quantum dot light emitting display panel, or a micro light emitting diode (LED) display panel. Alternatively, the display panel DP may be a light receiving display panel, for example, the display panel DP may be a liquid crystal display panel. In this case, an electronic device including the display panel DP may further include a backlight unit that provides light to the display panel DP.

The display panel DP may include a first display substrate 100 (or a lower substrate) and a second display substrate 200 (or an upper substrate) spaced apart from the first display substrate 100 to face the first display substrate 100. Each of the first display substrate 100 and the second display substrate 200 may include a plurality of layers. A cell gap may be located between the first display substrate 100 and the second display substrate 200. The cell gap may be maintained by a sealant SLM through which the first display substrate 100 and the second display substrate 200 are coupled to each other.

A gradation display layer for generating an image may be disposed between a base layer of the first display substrate 100 and a base layer of the second display substrate 200. The gradation display layer may include an organic emission layer, a micro LED element, or a liquid crystal layer according to types of the display panel DP.

The display panel DP may display an image through a display surface DP-IS. An outer surface 200-OS of the second display substrate 200 illustrated in FIG. 1B may be the display surface DP-IS of FIG. 1A.

The display surface DP-IS is parallel to a surface defined by a first directional axis DR1 and a second directional axis DR2. The display panel DP may include a display area DA and a non-display area NDA. The display surface DP-IS may include the display area DA and the non-display area NDA. A pixel PX is disposed on the display area DA and is not disposed on the non-display area NDA. The non-display area NDA may be disposed along an edge of the display surface DP-IS. The non-display area NDA may surround the display area DA. In an embodiment of the inventive concept, the non-display area NDA may be omitted or may be disposed at only one side of the display area DA. In addition, the non-display area NDA may be disposed at fewer than all sides of the display area DA.

A normal direction of the display surface DP-IS, e.g., a thickness direction of the display panel DP is indicated as a third directional axis DR3. A front surface (or a top surface) and a rear surface (or a bottom surface) of each of layers or units, which will be described below, are distinguished by the third directional axis DR3. However, the first to third directional axes DR1, DR2, and DR3 illustrated in this embodiment may be mere examples. Hereinafter, first to third directions may be directions indicated by the first to third directional axes DR1, DR2, and DR3 and designated by the same reference numerals, respectively.

Although the display panel DP having a planar display surface DP-IS is illustrated in the present embodiment of the inventive concept, the inventive concept is not limited thereto. The display panel DP may include a curved display surface or a solid display surface. The solid display surface may include a plurality of display areas that indicate different directions.

FIG. 2 illustrates an arrangement relationship between signal lines SL1 to SLn and DL1 to DLm and pixels PX11 to PXnm on a plane. The signal lines SL1 to SLn and DL1 to DLm may include a plurality of scan lines SL1 to SLn and a plurality of data lines DL1 to DLm.

A scan driver GDC may provide a scan signal to the scan lines SL1 to SLn. The scan driver GDC may be integrated with a predetermined area of the display panel DP. Alternatively, the scan driver GDC may be implemented as an independent integrated circuit chip and thus be electrically connected to one side of the display panel DP.

A data driver may be implemented as an independent integrated circuit chip and thus be electrically connected to pads DPD arranged at one side of the display panel DP. For example, the pads DPD may be arranged at a first side of the display panel DP and the scan driver GDC may be arranged at a second side of the display panel DP. Alternatively, the data driver may be integrated with a predetermined area of the display panel DP like the scan driver GDC. The data lines DL1 to DLm may be electrically connected to the pads DPD to receive a signal from the data driver. For example, the data lines DL1 to DLm may receive data signals (or voltages) from the data driver via the pads DPD Each of the pixels PX11 to PXnm is connected to a corresponding scan line of the plurality of scan lines SL1 to SLn and a corresponding data line of the plurality of data lines DL1 to DLm. Each of the pixels PX11 to PXnm n ay include a pixel driving circuit and a display element. Additional kinds of signal lines may lie provided on the display panel DP according to a configuration of the pixel driving circuit of the pixels PX11 to PXnm.

Figure 3A:
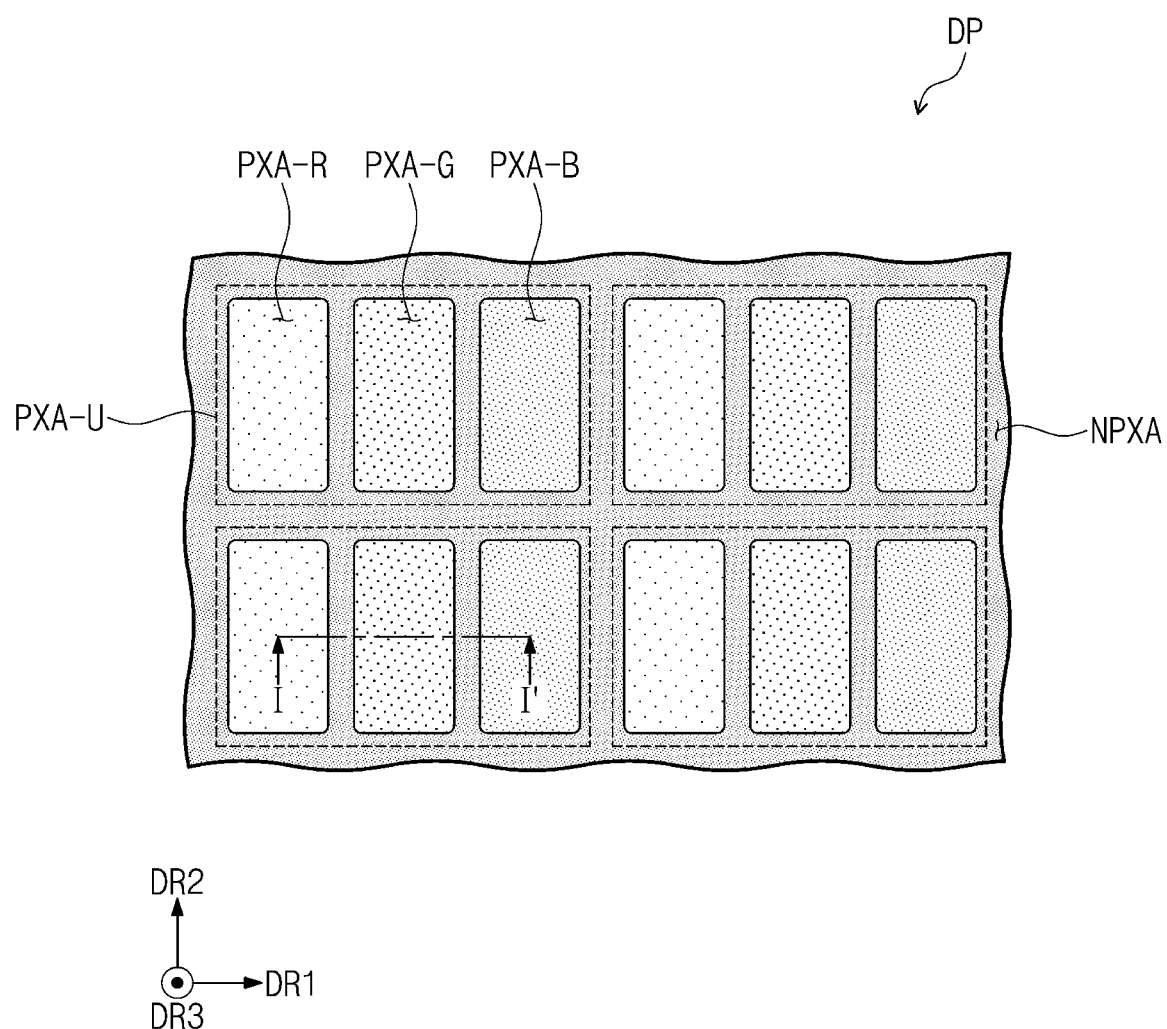
FIG. 3A is a plan view of the display panel according to an embodiment of the inventive concept.

FIG. 3A is a plan view of the display panel according to an embodiment of the inventive concept.

Referring to FIG. 3A, a plurality of pixel areas PXA-G, PXA-R, and PXA-B and a plurality of peripheral areas NPXA that are adjacent to the plurality of pixel areas PXA-G, PXA-R, and PXA-B may be provided on the display panel DP. The plurality of pixel areas PXA-G, PXA-R. and PXA-B illustrated in FIG. 3A are illustrated as being viewed from the outer surface 200-OS of the second display substrate 200 illustrated in FIG. 1B.

The plurality of pixel areas PXA-G, PXA-R, and PXA-B may include a first pixel area PXA-G, a second pixel area PXA-R, and a third pixel area PXA-B. The peripheral area NPXA may set a boundary between the first to third pixel areas PXA-G, PXA-R, and PXA-B to prevent colors from being mixed with each other between the first to third pixel areas PXA-G, PXA-R, and PXA-B. For example, the peripheral area NPXA may surround each of the first to third pixel areas PXA-G, PXA-R, and PXA-B.

The first pixel area PXA-G, the second pixel area PXA-R, and the third pixel area PXA-B may be spaced apart from each other in the first direction DR1. The second pixel areas PXA-R, the first pixel areas PXA-G, and the third pixel areas PXA-B may be alternately and repeatedly disposed in the first direction DR1.

One first pixel area PXA-G, one second pixel area PXA-R, and one third pixel area PXA-B constitute one unit area PXA-U. The plurality of unit areas PXA-U may be arranged in the first direction DR1 and the second direction DR2.

Figure 3B:
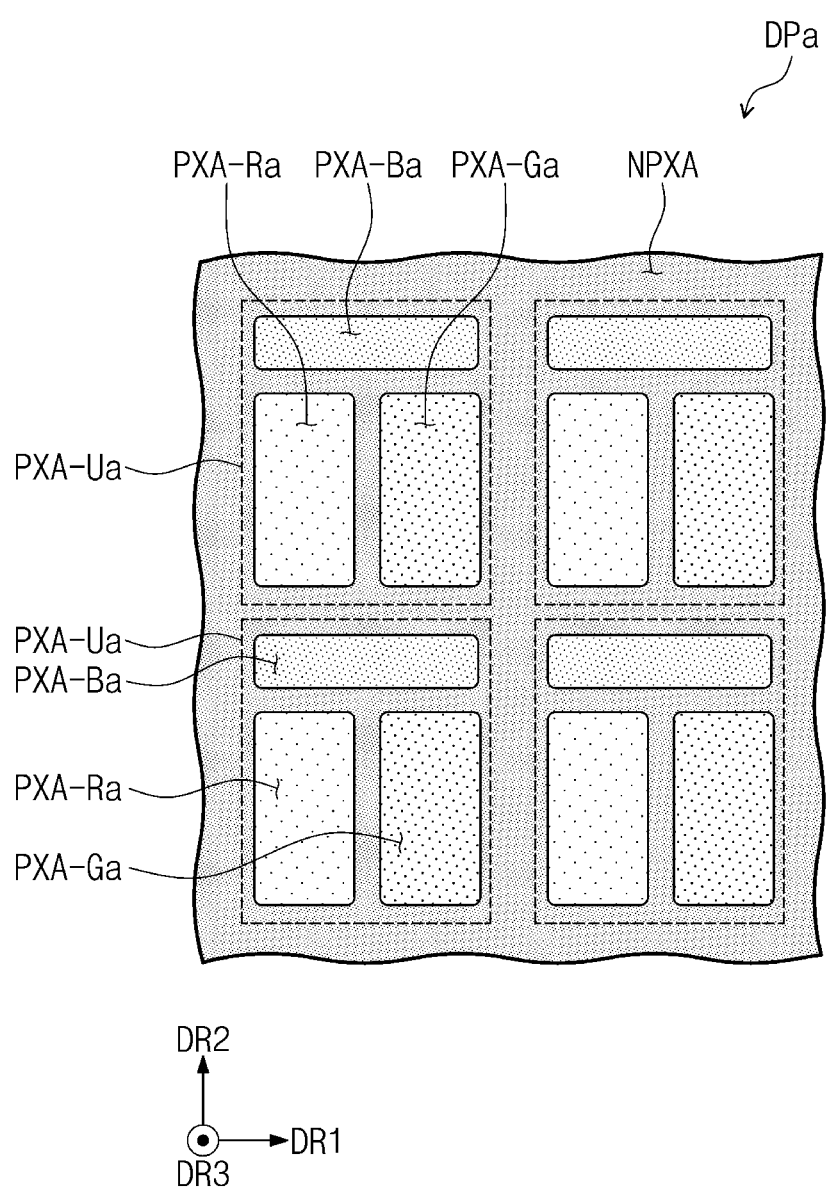
FIG. 3B is a plan view of a display panel according to an embodiment of the inventive concept.

FIG. 3B is a plan view of the display panel according to an embodiment of the inventive concept.

Referring to FIG. 3B, a plurality of pixel areas PXA-Ga, PXA-Ra, and PXA-Ba and a plurality of peripheral areas NPXA that ere adjacent to the plurality of pixel areas PXA-Ga, PXA-Ra, and PXA-Ba may be provided on a display panel DPa. The plurality of pixel areas PXA-Ga. PXA-Ra, and PXA-Ba illustrated in FIG. 3B are illustrated as being viewed from the outer surface 200-OS of the second display substrate 200 illustrated in FIG. 1B.

One first pixel area PXA-Ga, one second pixel area PXA-Ra, and one third pixel area PXA-Ba constitute one unit area PXA-Ua. The plurality of unit areas PXA-Ua may be arranged in the first direction DR1 and the second direction DR2.

The first pixel area PXA-Ga and the second pixel area PXA-Ra may be spaced apart from each other in the first direction DR1 within one unit area PXA-Ua, and the third pixel area PXA-Ba may be spaced apart from the first pixel area PXA-Ga and the second pixel area PXA-Ra in the second direction DR2 within one unit area PXA-Ua.

A width of the third pixel area PXA-Ba in the first direction DR1 may be greater than each of a width of the first pixel area PXA-Ga in the first direction DR1 and a width of the second pixel area PXA-Ra in the first direction DR1. A width of the third pixel area PXA-Ba in the second direction DR2 may be less than each of a width of the first pixel area PXA-Ga in the second direction DR2 and a width of the second pixel area PXA-Ra in the second direction DR2.

FIGS. 3A and 3B illustrate an arrangement relationship of the first to third pixel areas PXA-G, PXA-R, and PXA-B or PXA-Ga, PXA-Ra, and PXA-Ba, but the arrangement relationship is not particularly limited.

Figure 4A:
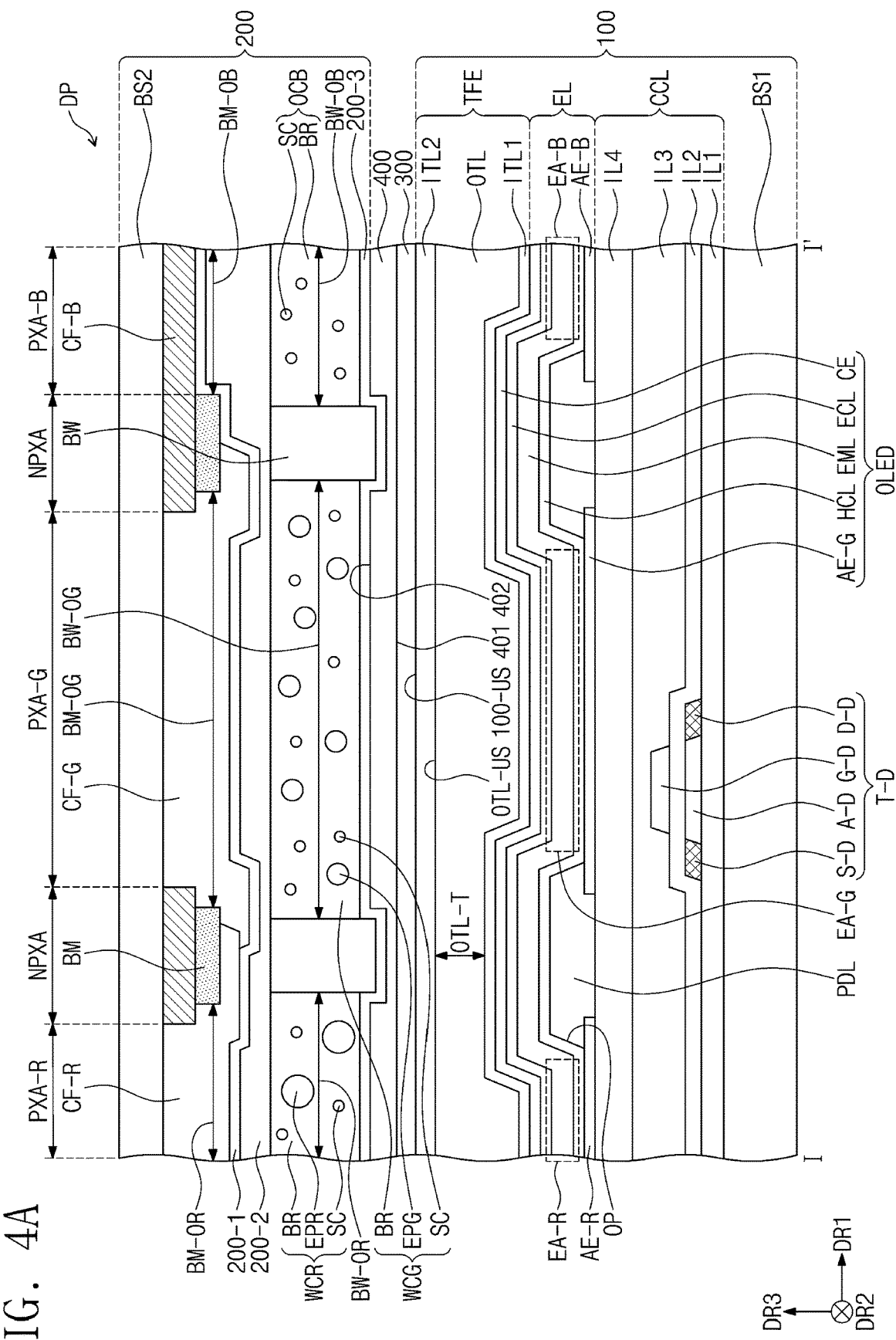
FIG. 4A is a cross-sectional view taken along line I-I' of FIG. 3A according to an embodiment of the inventive concept.
Figure 4B:
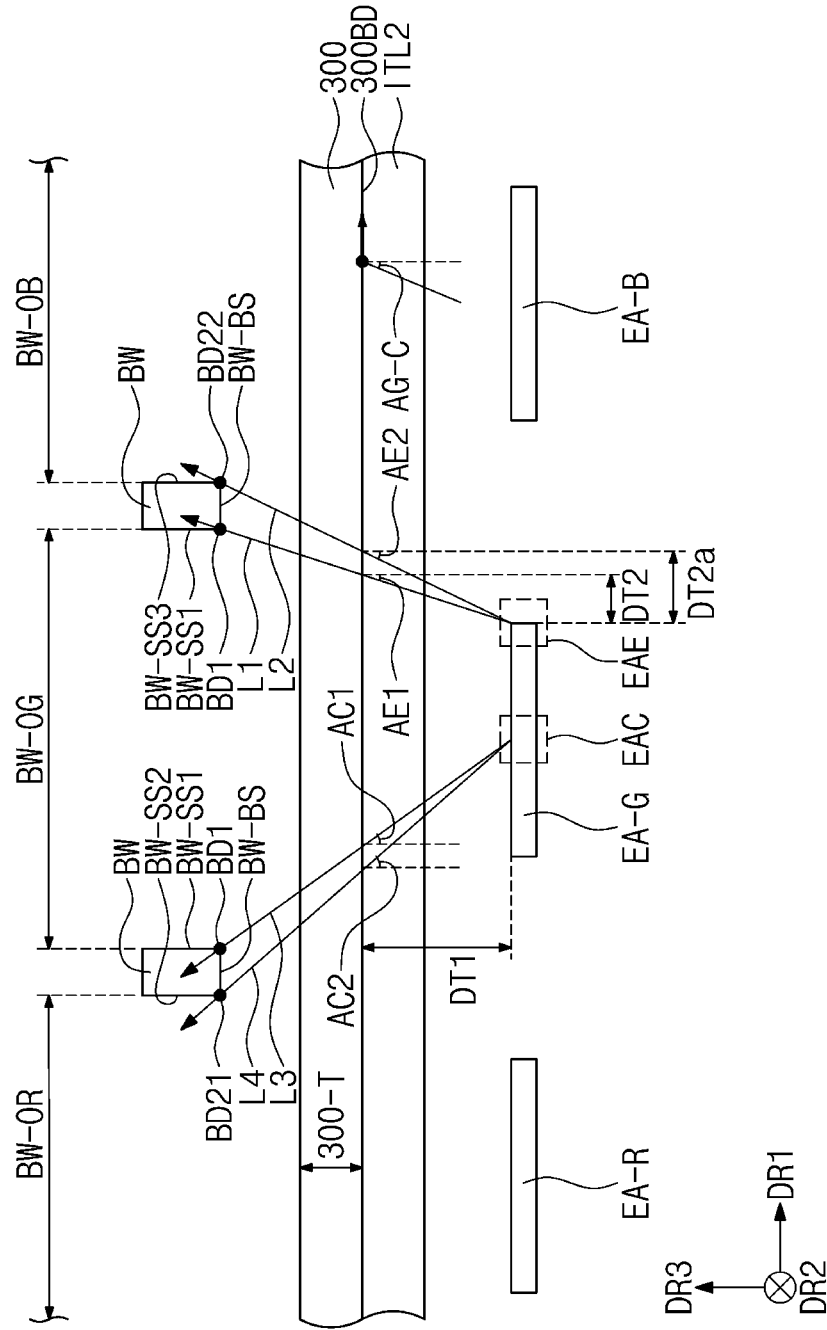
FIG. 4B is a schematic cross-sectional view illustrating a portion of FIG. 4A.

FIG. 4A is a cross-sectional view taken along line I-I' of FIG. 3A according to an embodiment of the inventive concept. FIG. 4B is a schematic cross-sectional view illustrating a portion of FIG. 4A. FIG. 4C is a schematic plan view illustrating a portion of FIG. 4B.

Referring to FIG. 4A, the first pixel area PXA-G, the second pixel area PXA-R, the third pixel area PXA-B, and the peripheral area NPXA may be provided on the display panel DP.

The display panel DP may provide first color light through the first pixel area PXA-G, second color light through the second pixel area PXA-R, and third color light through the third pixel area PXA-B. The first color light, the second color light, and the third color light may be light having colors different from each ether. For example, one of the first to third color lights may be green light, another may be red light, and yet another may be blue light.

The peripheral area NPXA may be an area disposed adjacent to the first pixel area PXA-G, the second pixel area PXA-R, and the third pixel area PXA-B. The peripheral area NPXA may set a boundary between the first pixel area PXA-G, the second pixel area PXA-R. and the third pixel area PXA-B. For example, in FIG. 4A, the peripheral area NPXA is disposed between the first pixel area PXA-G and the second pixel area PXA-R and between the first pixel area PXA-G and the third pixel area PXA-B. The peripheral area NPXA may prevent colors from being mixed between the first pixel areas PXA-G, the second pixel areas PXA-R, and the third pixel areas PXA-B. In addition, the peripheral area NPXA may block source light so that the source light is not observed by a user.

The display panel DP may include a first display substrate 100, a second display substrate 200, a functional layer 300, and a filling layer 400. In FIG. 4A, a case in which the display panel DP is the organic light emitting display panel will lie described as an example.

The first display substrate 100 may include a first base layer BS1 (or a base layer), a circuit layer CCL, a display element layer EL, and a thin film encapsulation layer TFE. The circuit layer CCL may be disposed on the first base layer BS1. The circuit layer CCL may include a plurality of insulating layers, a plurality of conductive layers, and a semiconductor layer. The display element layer EL may be disposed on the circuit layer CCL. The thin film encapsulation layer TFE may be disposed on the display element layer EL to seal the display element layer EL.

The first base layer BS1 may be a silicon substrate, a plastic substrate, an insulating film, or a laminate structure including a plurality of insulating layers.

The circuit layer CCL may include a plurality of transistors and a plurality of insulating layers IL1, IL2, IL3, and IL4. In FIG. 4A, one driving transistor T-D is illustrated. The plurality of insulating layers IL1, IL2, IL3, and IL4 may include a first insulating layer IL1, a second insulating layer IL2, a third insulating layer IL3, and a fourth insulating layer IL4.

The first insulating layer IL1 may be disposed on the first base layer BS1, and the driving transistor T-D may be disposed on the first insulating layer IL1. The driving transistor T-D may include an active A-D, a source S-D, a drain D-D, and a gate G-D. In other words, the driving transistor T-D may include an active region, a source region, a drain region and a gate region.

The active A-D, the source S-D, and the drain D-D may be regions that are divided according to a doping concentration or conductivity of a semiconductor pattern used to form the driving transistor T-D. The active A-D, the source S-D, and the drain D-D may be disposed on the first insulating layer IL1. The active A-D, the source S-D, and the drain D-D may have an adhesive force greater than that of the first base layer BS1 with respect to the first insulating layer IL1.

The first insulating layer IL1 may be a barrier layer that protects a bottom surface of each of the active A-D, the source S-D, and the drain D-D. In this case, the first insulating layer IL1 may prevent contamination or moisture introduced through the first base layer BS1 itself or the first base layer BS1 from being permeated into the active AD, the source SD, and the drain D-D. Alternatively, the first insulating layer IL1 may be a light blocking layer that blocks external light incident through the first base layer BS1 from being incident into the actives A-D. In this case, the first insulating layer IL1 may further include a light blocking material.

The second insulating layer IL2 may be disposed on the first insulating layer IL1 to cover the active A-D, the source S-D, and the drain D-D. The second insulating layer L2 may include an inorganic material. The inorganic material may include silicon nitride, silicon oxynitride, silicon oxide, titanium oxide, or aluminum oxide.

The gate G-D may be disposed on the second insulating layer IL2. The third insulating layer IL3 may be disposed on the second insulating layer IL2 to cover the gate G-D. The third insulating layer IL3 may be provided as a single layer or a plurality of layers. For example, the single layer of the third insulating layer IL3 may include an inorganic layer. The plurality of layers of the third insulating layer IL3 may include an organic layer and an inorganic layer.

The fourth insulating layer IL4 tray be disposed on the third insulating layer IL3. The fourth insulating layer IL4 may be provided as a single layer or a plurality of layers. For example, the single layer of the fourth insulating layer IL4 may include an organic layer. The plurality of layers of the fourth insulating layer IL4 may include an organic layer and an inorganic layer. The fourth insulating layer IL4 may be a planarization layer providing a flat surface on a top surface thereof.

The display element layer EL may lie disposed on the fourth insulating layer IL4. The display element layer EL may include a light emitting element OLED and a pixel defining layer PDL. In this embodiment, the light emitting element OLED may be an organic light emitting diode, but is not limited thereto. For example, the light emitting element OLED may be a micro LED element or a nano LED element. For example, the pixel defining layer PDL may be an organic layer.

The light omitting element OLED may include a first electrode AE-G thereinafter, referred to as a first pixel electrode), a hole control layer HCL, an emission layer EML, an electron control layer ECL, and a second electrode CE (hereinafter, referred to as a common electrode). The first pixel electrode AE-G may be provided separately for each pixel. In FIG. 4A, a first pixel electrode AE-G, a second pixel electrode AE-R, and a third pixel electrode AE-B are illustrated.

The first pixel electrode AE-G nay be disposed to correspond to the first pixel area PXA-G, the second pixel electrode AE-R may be disposed to correspond to the second pixel area PXA-R, and the third pixel electrode AE-B may be disposed to correspond to the third pixel area PXA-B. Herein, "correspond" may mean that the two components overlap each other when viewed from a thickness direction DR3 of the display panel DP, but are not limited to the same area. For example, the first pixel electrode AE-G and the first pixel area PXA-G may overlap each other in the thickness direction DR3 of the display panel DP.

The first pixel electrode AE-G, the second pixel electrode AE-R, and the third pixel electrode AE-B may be disposed on the fourth insulating layer IL4. Each of the first pixel electrode AE-G, the second pixel electrode AE-R. and the third pixel electrode AE-B may be directly or indirectly electrically connected to a corresponding driving transistor. For example, the first pixel electrode AE-G may be directly or indirectly connected to the driving transistor T-D illustrated in FIG. 4A.

The pixel defining layer PDL may expose a portion of each of the first pixel electrode AE-G, the second pixel electrode AE-R, and the third pixel electrode AE-B. For example, emission openings OP may be defined in the pixel defining layer PDL. A portion of each of the first pixel electrode AE-G, the second pixel electrode AE-R, and the third pixel electrode AE-B may be exposed by each of the emission openings OP.

The hole control layer HCL, the emission layer EML, the electron control layer ECL, and the second electrode CE may be commonly disposed on the first pixel area PXA-G, the second pixel area PXA-R, the third pixel area PXA-B, and the peripheral area NPXA. The hole control layer HCL may include a hole transport layer and may further include a hole injection layer. The electron control layer ECL may include an electron transport layer and may further include an electron injection layer.

The emission layer EML may have a single layer structure or a tandem structure. The emission layer EML may generate blue light. The blue light may include a wavelength of about 410 nm (nanometer) to about 480 nm. An emission spectrum of the blue light may have a peak within a wavelength of about 440 nm to about 460 nm. The emission layer EML may be commonly disposed on the first to third pixel areas PXA-G, PXA-R, and PXA-B or may be independently disposed. The independent disposition may mean that the emission layer EML is separated for each of the first to third pixel areas PXA-G, PXA-R, and PXA-B.

A first emission area EA-G, a second emission area EA-R, and a third emission area EA-B may be provided on the emission layer EML. The first emission area EA-G may be a portion of the emission layer EML overlapping the first pixel electrode AE-G, the second emission area EA-R may be a portion of the emission layer EML overlapping the second pixel electrode AE-R, and the third emission area EA-B may be a portion of the emission layer EML overlapping the third pixel electrode AE-B. For example, the first emission area EA-G may overlap the first pixel electrode AE-G in the thickness direction DR3.

In addition, the first emission area EA-G may correspond to the first pixel area PXA-G, the second emission area EA-R may correspond to the second pixel area PXA-R, and the third emission area EA-B may correspond to the third pixel area PXA-B. Here, "correspondence" means that the two components overlap each other when viewed from a thickness direction DR3 of the display panel DP, but are not limited to the same area.

The thin film encapsulation layer TFE may be disposed on the emission layer EML. For example, the thin film encapsulation layer TFE may be directly disposed on the display element layer EL. The thin film encapsulation layer TFE may include a first inorganic encapsulation layer ITL1, an organic encapsulation layer OTL, and a second inorganic encapsulation layer ITL2, which are sequentially laminated. The organic encapsulation layer OTL may be disposed between the first inorganic encapsulation layer ITL1 and the second inorganic encapsulation layer ITL2. The first inorganic encapsulation layer ITL1 and the second inorganic encapsulation layer ITL2 may be formed by depositing an inorganic material, and the organic encapsulation layer OTL may be formed by depositing, printing, or applying an organic material.

The first inorganic encapsulation layer ITL1 and the second inorganic encapsulation layer ITL2 protect the display element layer EL from moisture and oxygen, and the organic encapsulation layer OTL protects the display element layer EL from foreign substances such as dust particles. Each of the first inorganic encapsulation layer ITL1 and the second inorganic encapsulation layer ITL2 may include silicon nitride, silicon oxide nitride, silicon oxide, titanium oxide, or aluminum oxide. For example, the organic encapsulation layer OTL may include an acrylic-based organic layer. However, the embodiment of the inventive concept is not limited thereto.

The organic encapsulation layer OTL may provide a planarized top surface OTL-US. For example, the top surface OTL-US of the organic encapsulation layer OTL disposed on the display area DA (see FIG. 1A) may be a surface that is substantially parallel to a plane defined in the first direction DR1 and the second direction DR2. The second inorganic encapsulation layer ITL2 is disposed on the top surface OTL-US. The second inorganic encapsulation layer ITL2 may be flat to correspond to the shape of the top surface OTL-US. In other words, the top surface OTL-US of the second inorganic encapsulation layer ITL2 disposed on the display area DA (see FIG. 1A) may be a flat surface.

Although the thin film encapsulation layer TFE includes two inorganic layers and one organic layer in FIG. 4A, the embodiment of the inventive concept is not limited thereto. For example, the thin film encapsulation layer TFE may include three inorganic layers and two organic layers. In this case, the inorganic layers and the organic layers may be alternately laminated.

The second display substrate 200 may be disposed on the first display substrate 100. The second display substrate 200 may include a second base layer BS2 (or cover base layer), a first color filter CF-G, a second color filter CF-R, a third color filter CF-B, a first light conversion pattern WCG, a second light conversion pattern WCR, an optical pattern OCB, a first division partition wall BM (or light blocking layer), a second division partition wall BW (or division partition wall), and a plurality of insulating layers 200-1, 200-2, and 200-3.

The second base layer BS2 may be a silicon substrate, a plastic substrate, an insulating film, or a laminate structure including a plurality of insulating layers.

The third color filter CF-B may be disposed on one surface of the second base layer BS2. For example, the third color filter CF-B may be disposed on a bottom surface of the second base layer BS2. The third color filter CF-B may be disposed on the peripheral area NPXA and the third pixel area PXA-B. For example, the third color filter CF-B may extend from the third pixel area PXA-B to the peripheral area NPXA. In addition, the third color filter CF-B may be disposed between the first pixel area PXA-G and the second pixel area PXA-R. An opening corresponding to each of the first and second pixel areas PXA-G and PXA-R may be in the third color filter CF-B.

The first division partition wall BM may be disposed under the third color filter CF-B. For example, the first division partition wall BM may be disposed on the peripheral area NPXA. A first light blocking opening BM-OG, a second light blocking opening BM-OR, and a third light blocking opening BM-OB may be defined by the first division partition wall BM. For example, the first light blocking opening BM-OG, the second light blocking opening BM-OR, and the third light blocking opening BM-OB may be separated from each other by the first division partition wall BM.

The first division partition wall BM may include a light blocking material, for example, a black coloring agent. The first division partition wall BM may include a black dye and a black pigment, which are mixed with a base resin. In an embodiment of the inventive concept, the black component may include carbon black, a metal such as chromium, or an oxide thereof. The first division partition wall BM may be, for example, a black matrix.

The first light blocking opening BM-OG, the second light blocking opening BM-OR, and the third light blocking opening BM-OS may correspond to the first pixel area PXA-G, the second pixel area PXA-R. and the third pixel area PXA-B, respectively.

The first color filter CF-G may cover the first light blocking opening BM-OG and be disposed under the second base layer BS2. The second color filter CF-R may cover the second light blocking opening BM-OR and be disposed under the second base layer BS2. The third color filter CF-B may overlap the third light blocking opening BM-OB. The first color filter CF-G may transmit the first color light, the second color filter CF-R may transmit the second color light, and the third color filter CF-B may transmit the source light provided from the emission layer EML.

Each of the first to third color fillers CF-G, CF-R, and CF-B transmits light having a specific wavelength range and blocks light except for the corresponding wavelength range. Each of the first to third color filters CF-G, CF-R, and CF-B includes a base resin and a dye and/or pigment dispersed in the base resin. The base resin may be a medium in which the dye and/or pigment are dispersed. The base resin may include various resin compositions referred to as binders.

For example, the first color filter CF-G may be a green color filter, the second color filter CF-R may be a red color filter, and the third color filter CF-B may be a blue color filter. In an embodiment of the inventive concept, the first color filter CF-G and the second color filter CF-R may be yellow color filters. In this case, the first color filter CF-G and the second color filter CF-R may be connected to each other.

The first insulating layer 200-1 may be disposed under the first color filter CF-G, the second color filter CF-R. and the third color filter CF-B to cover the first color filter CF-G, the second color filter CF-R, and the third color filter CF-B. The second insulating layer 200-2 may cover the first insulating layer 200-1 to provide a flat surface at a lower side thereof. The first insulating layer 200-1 may be an inorganic layer, and the second insulating layer 200-2 may be an organic layer.

The second division partition vail BW may be disposed under the second insulating layer 200-2. The second division partition wall BW may be disposed on the peripheral area NPXA. A first opening BW-OG, a second opening BW-OR, and a third opening BW-OB may be defined by the second division partition wall BW. For example, the second division partition wall BW may separate the first opening BW-OG, the second opening BW-OR, and the third opening BW-OB from each other. The second division partition wall BW may include a material having transmittance less than or equal to a predetermined value. For example, the second division partition wall BW may include a light blocking material and may include, for example, a black component. The second division partition wall BW may include a black dye and a black pigment, which are mixed with the base resin. For example, the second division partition wall BW may include propylene glycol methyl ether acetate, 3-methoxy-n-butyl acetate, an acrylate monomer, an acrylic monomer, an organic pigment, or an acrylate ester.

The First opening BW-OG, the second opening BW-OR, and the third opening BW-OB may correspond to the first pixel area PXA-G, the second pixel area PXA-R, and the third pixel area PXA-B, respectively.

The first light conversion pattern WCG may be disposed inside the first opening BW-OG to convert the source light into the First color light. For example, the First light conversion pattern WCG may be disposed between the First light blocking opening BM-OG and the first emission area EA-G. The second light conversion pattern WCR may be disposed inside the second opening BW-OR to convert the source light into the second color light. The optical pattern OCB may be disposed inside the third opening BW-OB to transmit the source light.

Each of the first light conversion pattern WCG, the second light conversion pattern WCR, and the optical pattern OCB may be formed by an inkjet process. Compositions may be provided in spaces defined by the second division partition wall BW, for example, the first opening BW-OG, the second opening BW-OR, and the third opening BW-OB to form the first light conversion pattern WCG, the second light conversion pattern WCR, and the optical pattern OCB, respectively.

The first light conversion pattern WCG may include a base resin BR, a first quantum dot EPG, and scattering particles SC, the second light conversion pattern WCR may include a base resin BR, a second quantum dot EPR, and scattering particles SC, and the optical pattern OCB may include a base resin BR and scattering particles SC. In an embodiment of the inventive concept, the scattering particles SC may be omitted from any one of the first light conversion pattern WCG, the second light conversion pattern WCR, and the optical pattern OCB.

The base resin BR may be a medium in which the first quantum dots EPG, the second quantum dots EPR, or the scattering panicles SC are dispersed and may be made of various resin compositions that may be referred to as binders. However, the embodiment of the inventive concept is not limited thereto. In this specification, a medium capable of dispersing the first and second quantum dots EPG and EPR may be called and employed as the base resin BR regardless of its name, additional other functions, constituent materials, and the like. The base resin BR may be a polymer resin. For example, the base resin BR may include an acrylic-based resin, a urethane-based resin, a silicon-based resin, or an epoxy-based resin. The base resin BR may be a transparent resin.

The scattering particles SC may be titanium dioxide $TiO_2$ or silica-based nano-particles. The scattering particles SC may scatter incident light to increase in amount of light provided from the outside. In an embodiment of the inventive concept, at least one of the first light conversion pattern WCG or the second light conversion pattern WCR may not include the scattering panicles SC.

The first and second quantum dots EPG and EPR may be particles that convert a wavelength of the incident light. Each of the first and second quantum dots EPG and ERR may be a material having a crystal structure having a size of several nanometers. A quantum dot may be composed of hundreds to thousands of atoms to provide a quantum confinement effect in which an energy band gap increases due to the small size. When light of a wavelength having energy greater than that of the band gap is incident into the first and second quantum dots EPG and EPR, the first and second quantum dots EPG and EPR absorb the light to be excited and also emit light of a specific wavelength to fall to a ground state. The emitted light has a value corresponding to the band gap. When the first and second quantum dots EPG and EPR are adjusted in size and composition, light emitting characteristics due to a quantum confinement effect may be adjusted.

A core of each of the first and second quantum dots may be selected from Group II-VI compounds, Group III-V compounds, Group IV-VI compounds, Group IV elements, Group IV compounds, and a combination thereof.

The Group II-VI compounds may be selected from binary element compounds selected from the group consisting of CdSe, CdTe, CdS, ZnS, ZnSe. ZnTe. ZnO, HgS, HgSe, HgTe, MgSe, MgS, and a combination thereof, ternary element compounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from the group consisting of HgZnTeS, CdZnSeS. CdZnSeTe, CdZnSTe, CdHgSeS. CdHgSeTe, CdHgSTe. HgZnSeS, HgZnSeTe. HgZnSTe, and a combination thereof.

Group III-VI compounds may include binary compounds such as $In_2S_3$ and $In_2Se_3$; ternary compounds such as $InGaS_3$ and $InGaSe_3$; or any combination thereof.

The I-III-VI group compounds may be selected from ternary compounds selected from rite group consisting of AgInS, $AgInS_2$, CuInS, $CuInS_2$, $AgGaS_2$, $CuGaS_2$ $CuGaO_2$, $AgGaO_2$, $AgAlO_2$ and mixtures thereof or quaternary compounds such as $AgInGaS_2$ and $CuInGaS_2$.

The Group III-V compounds may be selected from binary element compounds selected from the group consisting of GaN, GaP, GaAs, GaSb, AlN, AlP, AlAs, AlSb, InN, InP, InAs, InSb, and a combination thereof, ternary element compounds selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InSb, and a combination thereof, and quaternary element compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group III-V compounds may further include the Group II metal. For example, InZnP or the like may be selected as the group III-II-V compounds.

The Group IV-VI compounds may be selected from binary element compounds selected from the group consisting of SnS, SnSe, SnTe, PbS, PbSe, PbTe, and a combination thereof, ternary element compounds selected from die group consisting of SnSeS, SnSeTe, SnSTe, PbSeS, PbSeTe, PbTe, SnPbS, SnPbSe, SnPbTe, and a combination thereof and quaternary element compounds selected from the group consisting of SnPbSSe, SnPbSeTe, SnPbSTe. and a combination thereof. The Group IV elements may be selected from the group consisting of Si, Ge, and a combination thereof. The Group IV compounds may be binary element compounds selected from the group consisting of SiC, SiGe, and a combination thereof.

Here, the binary element compounds, the ternary element compounds, and the quaternary element compounds may exist in the particle at a uniform concentration or exist in the particle in a state in which concentration distribution is partitioned into partially different states. Alternatively, the quantum dot may have a core/shell structure in which one quantum dot surrounds the other quantum dot. An interface between the core and the shell may have a concentration gradient in which an element existing in the shell has a concentration that gradually decreases toward a center.

In some embodiments of the inventive concept, the first and second quantum dots EPG and EPR may have a core shell structure including a core including the aforementioned nanocrystal and a shell surrounding the core. The shell of the first and second quantum dots EPG and EPR may serve as a protective layer for maintaining semiconductor characteristics by preventing chemical modification of the core and/or serve as a charging layer for imparting electrophoretic characteristics to the first and second quantum dots EPG and EPR. The shell may be a single layer or a multi-layer. An interface between the core and the shell may have a concentration gradient in which an element existing in the shell has a concentration that gradually decreases toward a center. Examples of the shell of the first and second quantum dots EPG and EPR include metal or non-metal oxides, semiconductor compounds, or a combination thereof.

For example, the oxide of the metal or nonmetal may include binary element compounds of $SiO_2$, $Al_2O_3$, $TiO_2$, ZnO, MnO, $Mn_2O_3$, CuO, FeO, $Fe_2O_3$, $Fe_3O_4$, CoO, $Co_3O_4$, NiO, and the like or ternary element compounds $MgAl_2O_4$, $CoFe_2O_4$, $NiFe_2O_4$, $CoMn_2O_4$, and the like, but the embodiment of the inventive concept is not limited thereto.

Alternatively, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the embodiment of the inventive concept is not limited thereto.

Each of the first and second quantum dots EPG and EPR may have a full width of half maximum (FWHM) of an emission wavelength spectrum of about 45 nm or less, e.g., about 40 nm or less, or about 30 nm or less. In this range, color purity and color reproducibility may be improved. In addition, light emitted through the first and second quantum dots EPG and EPR may be emitted in ail directions to improve an optical viewing angle.

In addition, each of the first and second quantum dots EPG and EPR is not specifically limited in shape. For example, the quantum dot may have a spherical shape, a pyramidal shape, a multi-arm shape, a cubic nanoparticle shape, a nanotube shape, a nanowire shape, a nanofiber shape, a nanoplate particle shape, or the like.

The first and second quantum dots EPG and EPR may control a color of light emitted according to a particle size, and thus, the first and second quantum dots EPG and EPR may emit various colors such as blue, ted, and green.

The third insulating layer 200-3 may cover the second division partition wall BW, the first light conversion pattern WCG, the second light conversion pattern WCR, and the optical pattern OCB. For example, the third insulating layer 200-3 may be an inorganic layer that seals the second division partition wall BW, the first light conversion pattern WCG, the second light conversion pattern WCR, and the optical pattern OCB.

The functional layer 300 and the filling layer 400 may be disposed between the first display substrate 100 and the second display substrate 200. For example, the filling layer 400 may be directly disposed on the second display substrate 200.

The functional layer 300 may be directly disposed on the first display substrate 100. For example, the first display substrate 103 may be a display layer. A top surface 100-US of the first display substrate 100 may be a surface of the second inorganic encapsulation layer ITL2 (or the uppermost layer). The top surface 100-US of the first display substrate 100 may be flat on the display area DA (see FIG. 1A). Thus, the functional layer 300 may also have a flat shape inside the display area DA (see FIG. 1A). That the functional layer 300 is flat may mean that it is parallel to a plane defined by at least two directional axes. For example, in the display area DA (see FIG. 1A), the top and bottom surfaces of the functional layer 300 may be parallel to the plane defined by the first direction DR1 and the second direction DR2.

The functional layer 300 may be continuously formed after a process in which the second inorganic encapsulation layer ITL2 is formed. For example, after forming the second inorganic encapsulation layer ITL2 in the same chamber, the functional layer 300 may be continuously formed. The functional layer 300 may include a transparent material capable of undergoing low-temperature plasma chemical vapor deposition. For example, the functional layer 300 may include SiOC, SiOCH, silicon oxide, silicon nitride, or silicon oxynitride, but is not limited thereto.

Referring to FIG. 4B, light incident at an incident angle greater than a total reflection critical angle AG-C on a boundary between the second inorganic encapsulation layer ITL2 and the functional layer 300 may be totally reflected at the boundary between the second inorganic encapsulation layer ITL2 and the functional layer 300.

The total reflection critical angle AG-C may be less than a reference incident angle of reference light traveling from the first emission area EA-G toward the second division partition wall BW. The reference light may mean light incident at an angle at which color mixing occurs. For example, the reference light may be light that proceeds from the first emission area EA-G toward the second light conversion pattern WCR or the optical pattern OCB that does not correspond to the first emission area EA-G.

According to an embodiment of the inventive concept, the total reflection critical angle AG-C is designed to be less than the reference incident angle. Thus, light incident at the angle at which the color mixing occurs may be totally reflected at the boundary between the second inorganic encapsulation layer ITL2 and the functional layer 300. Thus, the color mixing between adjacent pixel areas may be prevented, and display quality of the display panel DP may be increased.

The reference light may be one of first reference light L1, second reference light L2, third reference light L3, and fourth reference light L4. The first to fourth reference light L1, L2, L3, and L4 may be classified according to which portion of the first emission area EA-G it is emitted from or to which portion of the second division partition wall BW.

The first emission area EA-G may include an outer portion EAE and a central portion EAC. The outer portion EAE may be an area surrounding the central portion EAC. The outer portion EAE may be closer to a sidewall defining the emission opening OP of the pixel defining layer PDL than the central portion EAC. The first reference light L1 and the second reference light L2 may be light emitted from the outer portion EAE, and the third reference light L3 and the fourth reference light L4 may be light emitted from the central portion EAC.

The second division partition wall BW may include a first side surface BW-SS1 defining a first opening BW-OG, a second side surface BW-SS2 defining a second opening BW-OR, a third side surface BW-SS3 defining a third opening BW-OB, and a bottom surface BW-BS. The bottom surface BW-BS may be the lowermost surface of the second division partition wall BW. When viewed in the thickness direction of the display panel DP, for example, in the third direction DR3, the first side surface BW-SS1 may surround the first emission area EA-G, the second side surface BW-SS2 may surround the second emission area EA-R, and the third side surface BW-SS3 may surround the third emission area EA-B.

Referring to FIG. 4C, a first boundary BD1 may be a boundary surrounding the first emission area EA-G from which the reference light is emitted, and a second boundary BD21 or BD22 may be a boundary that surrounds another emission area adjacent to the first emission area EA-G from which the reference light is emitted. For example, the second boundary BD21 may surround the second emission area EA-R. A boundary between the first side surface BW-SS1 and the bottom surface BW-BS may be the first boundary BD1, and a boundary between the second side surface BW-SS2 and the bottom surface BW-BS and a boundary between the third side surface BW-SS3 and the bottom surface BW-BS may be a second boundary BD21 or BD22.

Referring again to FIG. 4B, the first reference light L1 and the third reference light L3 may be light incident toward the first boundary BDL and the second reference light L2 and the fourth reference light L4 may be light incident toward the second boundary BD21 or BD22. For example, the second reference light L2 may be light incident toward the second boundary BD22 and the fourth reference light L4 may be light incident towards the second boundary BD21.

First, second, third and fourth reference incident angles AE1, AE2, AC1, and AC2 may be incident angles of the first to fourth reference light L1, L2, L3, and L4 that are incident to a boundary surface 300BD between the functional layer 300 and the second inorganic encapsulation layer ITL2. The first to fourth reference incident angles AE1, AE2, AC1, and AC2 may satisfy the following relationship.

First reference incident angle AE1<third reference incident angle AC1<second reference incident angle AE2<fourth reference incident angle AC2. In other words, the first reference incident angle AE1 may be the smallest of the first to fourth reference incident angles AE1, AE2, AC1, and AC2 and the fourth reference incident angle AC2 may be the largest of the first to fourth reference incident angles AE1, AE2, AC1, and AC2. The total reflection critical angle AG-C (or critical angle) may be less than each of die first to fourth reference incident angles AE1, AE2, AC1, and AC2.

The second inorganic encapsulation layer ITL2 may have a first refractive index n1, and the functional layer 300 may have a second refractive index n2 less than die first refractive index n1. A difference valve between die first refractive index n1 of the second inorganic encapsulation layer ITL2 and the second refractive index n2 of the functional layer 300 may be determined so that the total reflection critical angle AG-C has a value less than the reference incident angle selected from the first to fourth reference incident angles AE1, AE2, AC1, and AC2.

The first to fourth reference incident angles AE1, AE2, AC1, and AC2 may vary depending on various variables. One of the variables may be a thickness OTL-T of the organic encapsulation layer OTL.

An embodiment of the inventive concept provides a display panel DP including: a first pixel area PXA-G, a second pixel area PXA-R, a third pixel area PXA-G, and a peripheral area NPXA that is adjacent to the first, second and third pixel areas; a base layer BS1; a circuit layer CCL disposed on the base layer; an emission layer EL disposed on the circuit layer and including a first emission area EA-G, a second emission area EA-R, and a third emission area EA-B, wherein each of the first, second and third emission areas generates source light, and wherein the first, second and third emission areas respectively correspond to the first pixel area, the second pixel area, and the third pixel area; an organic encapsulation layer OTL disposed on the emission layer, wherein a top surface of the organic encapsulation layer is flat; an inorganic encapsulation layer ITL2 disposed on the top surface of the organic encapsulation layer and having a first refractive index; a functional layer 300 disposed on the inorganic encapsulation layer and having a second refractive index less than the first refractive index; and a partition wall BW disposed on the functional layer and including a first opening BW-OG, a second opening BW-OR, and a third opening BW-OB, wherein the first, second and third openings respectively correspond to the first pixel area, the second pixel area, and the third pixel area, wherein a iota reflection critical angle AG-C between the inorganic encapsulation layer and the functional layer is less than a reference incident angle (AE1, AE2, AC1, AC2) of reference light traveling from the first emission area toward the partition wall.

Figure 5:
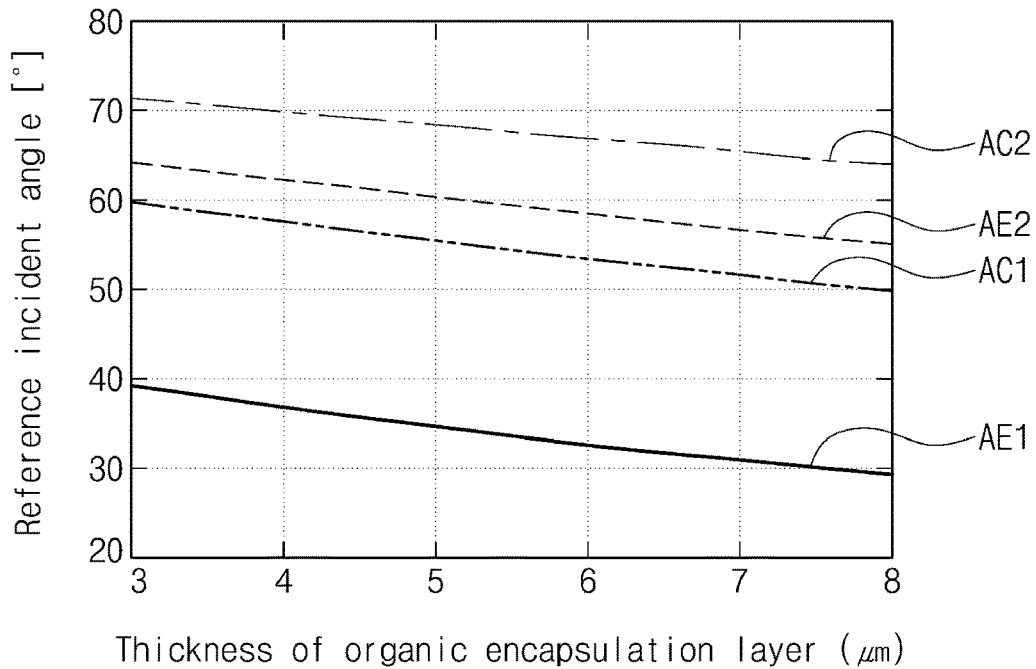
FIG. 5 shows graphs of a maximum incident angle according to a thickness of an organic encapsulation layer.

FIG. 5 shows graphs of a reference incident angle according to the thickness of the organic encapsulation layer.

Referring to FIGS. 4A, 4B, and 5, the first to fourth reference incident angles AE1, AE2, AC1, and AC2 may vary according to the thickness OTL-T of the organic encapsulation layer OTL. The thickness OTL-T of the organic encapsulation layer OTL may be a minimum thickness of the organic encapsulation layer OTL inside the display area DA (see FIG. 1A).

As the thickness OTL-T of the organic encapsulation layer OTL increases, each of the first to fourth reference incident angles AE1, AE2, AC1, and AC2 may decrease. The total reflection critical angle AG-C may be determined based on the first to fourth reference incident angles AE1, AE2, AC1, and AC2 calculated according to the thickness OTL-T of the organic encapsulation layer OTL.

Figure 6:
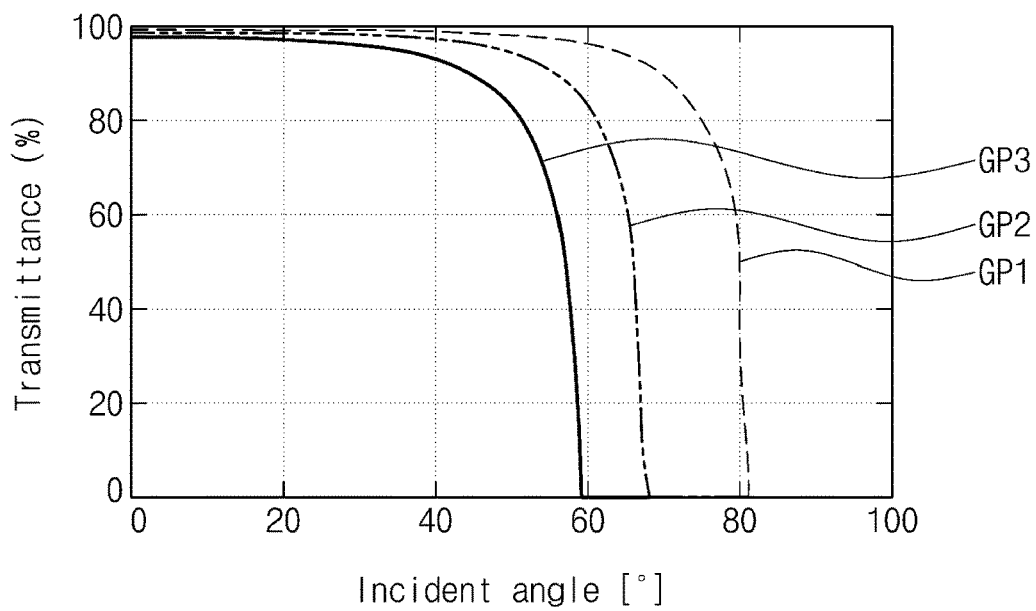
FIG. 6 shows graphs of transmittance according to an incident angle.

FIG. 6 shows graphs of transmittance according to an incident angle.

Referring to FIGS. 4A, 4B, and 5, a first graph GP1 may be a graph illustrating transmittance according to an incident angle when the second refractive index n2 of the functional layer 300 has a first value, a second graph GP2 may be a graph illustrating transmittance according to an incident angle when the second refractive index n2 of the functional layer 300 has a second value, and a third graph GP3 may be a graph illustrating transmittance according to an incident angle when the second refractive index n2 of the functional layer 300 has a third value.

The first value may be greater than each of the second value and the third value, and the second value may be greater than the third value. For example, the first value may be about 1.5, the second value may be about 1.4, and the third value may be about 1.3.

As the second refractive index n2 of the functional layer 300 decreases, the total reflection critical angle AG-C may decrease. For reference, die total reflection critical angle AG-C may be an incident angle when the transmittance is 0. In addition, as the second refractive index n2 of the functional layer 300 decreases, the transmittance may decrease. In other words, when the second refractive index n2 of the functional layer 300 decreases, a color matching rate may be improved, but luminous efficiency of the display panel DP may decrease. The color matching rate may have a higher value as no color mixing occurs.

Thus, according to an embodiment of the inventive concept, one of the first to fourth reference incident angles AE1, AE2, AC1, AC2 may be selected in consideration of the color matching rate and the luminous efficiency, and the second refractive index n2 of the functional layer 300 may be determined so that the total reflection critical angle AG-C is less than the selected reference incident angle.

Referring again to FIGS. 4A and 4B, the total reflection critical angle AG-C may be determined according to the transmittance of the second division partition wall BW. When the transmittance of the second division partition wall BW is less than a predetermined value, light traveling toward the second division partition wall BW may be absorbed to the second division partition wall BW. Thus, the total reflection threshold angle AG-C may be determined to be a value less than the second reference incident angle AE2. Alternatively, when the transmittance of the second division partition wall BW is greater than the predetermined value, the total reflection critical angle AG-C may be determined to be a value less than the first reference incident angle AE1. Alternatively, regardless of the transmittance of the second division partition wall BW, the total reflection critical angle AG-C may be determined based on the third reference incident angle AC1 having an intermediate value between the first reference incident angle AE1 and the second reference incident angle AE2.

The first reference incident angle AE1 may be given by the following equation:

$$\tan^{-1}\left(\frac{DT2}{DT1}\right).$$

The DT1 may be a distance DT1 between the first emission area EA-G and the functional layer 300. For example, the distance DT1 may be a distance between a top of the first emission area EA-G and the bottom of the functional layer 300. The DT2 may be a distance DT2 between one point, at which the first reference light L1 is emitted, inside the first emission area EA-G and one point of the functional layer 300 to which the first reference light L1 is incident when viewed from the third direction DR3. In other words, the distance DT2 may be a distance from a point from where the first reference light L1 is emitted from the outer portion EAE of the first emission area EA-G to a point where the first reference light L1 first contacts the functional layer 300.

The total reflection critical angle AG-C may be given by the following equation;

$$\sin^{-1}\left(\frac{n_2}{n_1}\right).$$

When the first refractive index $n_1$ is determined, a material having the second refractive index $n_2$ satisfying the following equation:

$$\sin^{-1}\left(\frac{n_2}{n_1}\right) < \tan^{-1}\left(\frac{DT2}{DT1}\right)$$

may be selected as a material constituting the functional layer 300.

When the total reflection critical angle AG-C is determined based on the second reference incident angle AE2, the second refractive index $n_2$ of the functional layer 300 may satisfy the following equation.

$$\sin^{-1}\left(\frac{n_2}{n_1}\right) < \tan^{-1}\left(\frac{DT2a}{DT1}\right)$$

As noted above, the DT1 may be a distance DT1 between the first emission area EA-G and the functional layer 300. The DT2a may be a distance DT2a between one point, at which the second reference light L2 is emitted, inside the first emission area EA-G and one point of the functional layer 300 to which the second reference light L2 is incident, when viewed from the third direction DR3. In other words, the distance DT2a may be a distance from a point from where the second reference light L2 is emitted from the outer portion EAE of the first emission area EA-G to a point where the second reference light L2 first contacts the functional layer 300.

A thickness 300-T of the functional layer 300 may be a thickness similar to a wavelength band of light to be reflected. For example, light to be reflected may be blue light, and thus, the thickness 300-T of the functional layer 300 may be about 400 nanometers to about 500 nanometers. However, this is merely an example, and the thickness 300-T of the functional layer 300 is not limited thereto.

A lower limit of the thickness 300-T of the functional layer 300 is not particularly limited, but may be, for example, about 20 angstroms or more. When the thickness 300-T of the functional layer 300 is less than about 20 angstroms, the functional layer 300 may not be evenly formed on the second inorganic encapsulation layer ITL2. In this case, the refractive index of the functional layer 300 may be different depending on the location of the functional layer 300. However, when the thickness 300-T of the functional layer 300 has a predetermined value or more, the functional layer 300 may have a uniform refractive index.

An upper limit of the thickness 300-T of the functional layer 300 is not particularly limited, but may be, for example, about 100 micrometers or less. The upper limit value of the thickness 300-T of the functional layer 300 may lie determined in consideration of the light efficiency of the display panel DF (see FIG. 1A). For example, as the thickness 300-T of the functional layer 300 is thicker, the light efficiency may decrease. As a result, the thickness 300-T of the functional layer 300 may be less than about 1 micrometer. However, it is not particularly limited thereto, and the upper limit may increase up to a level of about 10 micrometers to about 20 micrometers.

The thickness 300-T of the functional layer 300 may be uniform on the display area DA (see FIG. 1A). Each of top and bottom surfaces of the functional layer 300 may be flat. The boundary surface 300BD between the second inorganic encapsulation layer ITL2 corresponding to the bottom surface of the functional layer 300 and the functional layer 300 may be flat. This is because conformality of the organic encapsulation layer OTL disposed under the second inorganic encapsulation layer ITL2 is 0. That the conformity is 0 may mean that even if the bottom surface of the organic encapsulation layer OTL is uneven, the top surface of the organic encapsulation layer OTL is parallel to the reference surface. Since the boundary surface 300BD through which light incident at an angle at which the color mixing occurs is totally reflected is flat, the light control may be easier since the color mixing does not occur.

The filling layer 400 may be disposed between the functional layer 300 and the second display substrate 200. The filling layer 400 may be disposed between the functional layer 300 and the second division partition wall BW. The filling layer 400 may include a silicone polymer, an epoxy resin, or an acrylic resin.

A first surface 401 and a second surface 402 opposite to the first surface 401 may be provided on the filling layer 400. The first surface 401 may be in contact with the functional layer 300 and be a flat surface, and the second surface 402 may be uneven to correspond to shapes of the second division partition wall BW, the first light conversion pattern WCG, the second light conversion pattern WCR, and the optical pattern OCB.

Figure 7:
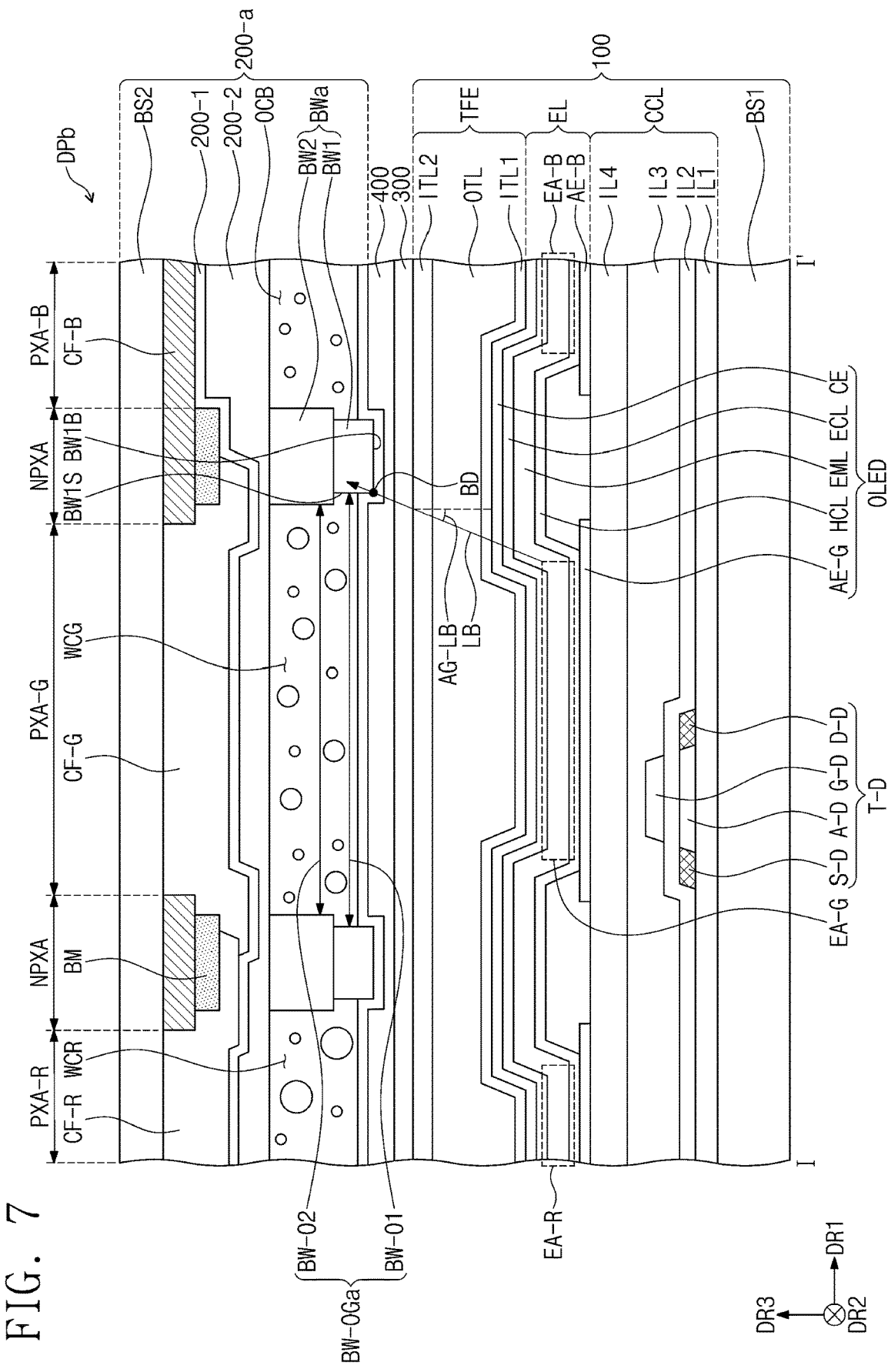
FIG. 7 is a cross-sectional view taken along line I-I' of FIG. 3A according to an embodiment of the inventive concept.

FIG. 7 is a cross-sectional view taken along line I-I' of FIG. 3A according to an embodiment of the inventive concept. In description of FIG. 7, descriptions of the same components as those described in FIG. 4A may be omitted.

Referring to FIG. 7, a display panel DPb may include a first display substrate 100 and a second display substrate 200-a. The second division partition wall BWa (or division partition wall) of the second display substrate 230-a may have a laminated structure including a plurality of layers. For example, the second division partition wall BWa may include a first sub division partition wall BW1 and a second sub division partition wall BW2. The Fust sub division partition wall BW1 may be disposed on the functional layer 300, and the second sub division partition wall BW2 may be disposed on the first sub division partition wall BW1.

A first opening portion BW-OGa may include a first opening portion BW-O1 defined by the first sub division partition wall BW1 and a second opening portion BW-O2 defined by the second sub division partition wall BW2. A width of the first opening portion BW-O1 may be greater than a width of the second opening portion BW-O2. The first opening portion BW-O1 may be closer to the functional layer 300 than the second opening portion BW-O2. Each of the second opening of the second division partition wall BWa corresponding to the second pixel area PXA-R and the third opening of the second division partition wall BWa corresponding to the third pixel area PXA-B may also include a first opening portion BW-O1 and a second opening portion BW-O2.

The total reflection critical angle between the functional layer 300 and the second inorganic encapsulation layer ITL2 may be less than the reference incident angle AG-LB of the reference light LB. The reference incident angle AG-LB may be an incident angle of the reference light LB incident onto the functional lever 300.

The light incident from the Fust emission area EA-G toward the boundary between a first side surface BW1S defining the first opening portion BW-O1 of the first sub division partition wall BW1 and the bottom surface BW1B of the first sub division partition wall BW1 connected to the first side surface BW1S may be the reference light LB. When viewed from the thickness direction of the display panel DPb, the boundary BD may surround the first emission area EA-G. However, the inventive concept is not limited thereto, and the boundary BD serving as the reference of the reference light LB may be a boundary surrounding the second emission area EA-R or the third emission area EA-B.

Figure 8:
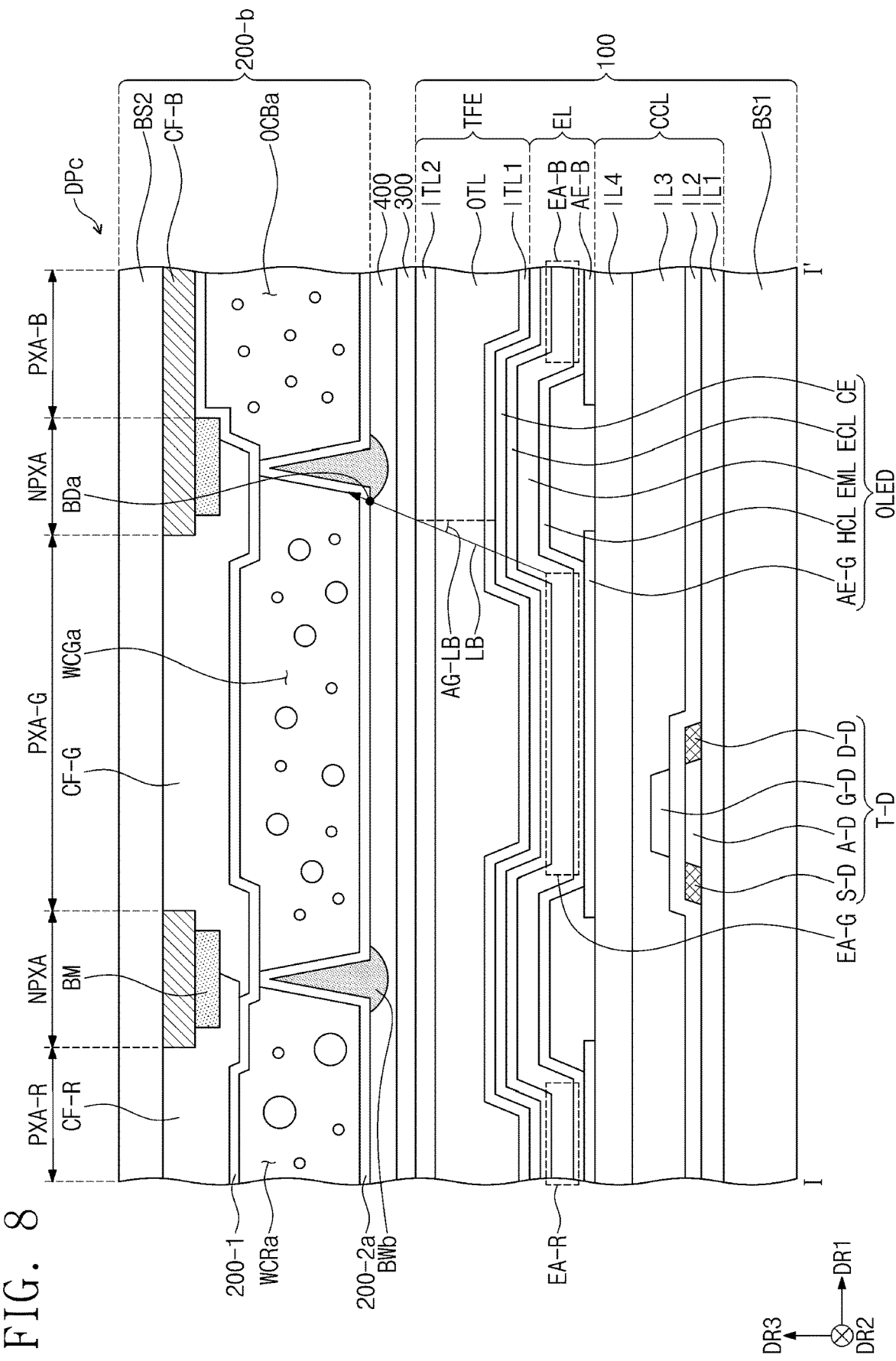
FIG. 8 is a cross-sectional view taken along line I-I' of FIG. 3A according to an embodiment of the inventive concept.

FIG. 8 is a cross-sectional view taken along line I-I' of FIG. 3A according to an embodiment of the inventive concept.

In description of FIG. 8, descriptions of the same components as those described in FIG. 4A may be omitted.

Referring to FIG. 8, a display panel DPc may include a first display substrate 100 and a second display substrate 200-b. A first light conversion pattern WCGa, a second light conversion pattern WCRa. and an optical pattern OCBa of the second display substrate 200-b may be disposed under a first insulating layer 200-1. Each of the first light conversion pattern WCGa, the second light conversion pattern WCRa, and the optical pattern OCBa may be formed by a photolithography process. A second insulating layer 200-2a may cover the first light conversion pattern WCGa, the second light conversion pattern WCRa. and the optical pattern OCBa. The second insulating layer 200-2a may be an inorganic layer that seals the first light conversion pattern WCGa, the second light conversion pattern WCRa. and the optical pattern OCBa.

A second division partition wall BWb (or partition wall) may be disposed under the second insulating layer 200-2a. The second division partition wall BWb may be disposed on a peripheral area NPXA. The second division partition wall BWb may contain a black component. The second division partition wall BWb may include a black dye and a black pigment, which are mixed with a base resin. The second division partition wall BWb may be filled in a space between the first light conversion pattern WCGa, the second light conversion pattern WCRa. and the optical pattern OCBa.

The total reflection critical angle between the functional layer 300 and the second inorganic encapsulation layer ITL2 may be less than the reference incident angle AG-LB of the reference light LB. The reference incident angle AG-LB may be an incident angle of the reference light LB incident onto the functional layer 300.

Light incident from the first emission region EA-G to a boundary BDa at which the second division partition wall BWb meets the second insulating layer 200-2a may be the reference light LB. When viewed from a thickness direction of the display panel DPc, the boundary BDa may overlap the first light conversion pattern WCGa. However, the inventive concept is not limited thereto, and the boundary BDa serving as the reference of the reference light LB may be a portion overlapping the second light conversion pattern WCRa or the optical pattern OCBa.

Figure 10:
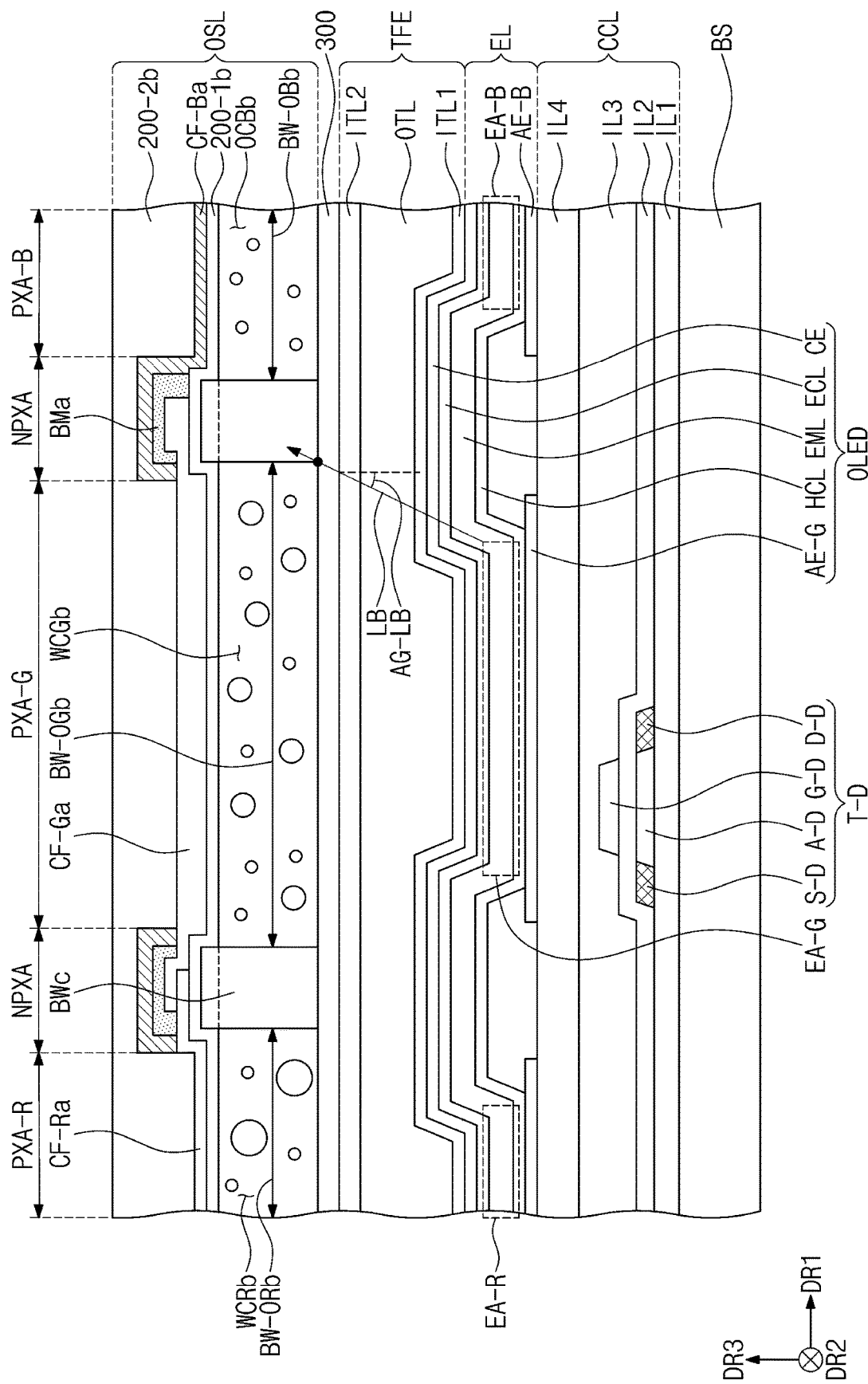
FIG. 10 is a cross-sectional view of a display panel according to an embodiment of the inventive concept.

FIG. 9A is a perspective view of a display panel according to an embodiment of the inventive concept. FIG. 9B is a cross-sectional view of the display panel according to an embodiment of the inventive concept. FIG. 10 is a cross-sectional view of a display panel according to an embodiment of the inventive concept.

Unlike the display panels DP, DPa, DPb, and DPc, which are illustrated in FIGS. 1A to 8, a display panel DPd according to this embodiment includes one base layer BS. In the manufacturing process, a process of coupling the first display substrate 100 (see FIG. 1A) to the second display substrate 200 (see FIG. 1A) is omitted, and structures may be sequentially formed on the base layer BS.

Referring to FIG. 9B, the display panel DPd includes a base layer BS, a circuit layer CCL disposed on the base layer BS, a display element layer EL disposed on the circuit layer CCL, a thin film encapsulation layer TFE disposed on the display element layer EL, a functional layer 300 disposed on the thin film encapsulation layer TFE, and a fight control layer OSL disposed on the functional layer 300.

The light control layer OSL may correspond to the second display substrate 200, 200-a, or 200-b described with reference to FIGS. 1A to 8. A difference between the second display substrate 200, 200-a, or 200-b and the light control layer OSL appears in the manufacturing process. Unlike the second display substrate 200, 200-a, or 200-b formed in a process separate from that of forming the first display substrate 100 (see FIG. 1A), the light control layer OSL may be formed on the functional layer 300 through a continuous process.

The light control layer OSL may include a first division partition wall BWc (or division partition wall), a first light conversion pattern WCGb, a second light conversion pattern WCRb, an optical patient OCBb, a first color filter CF-Ga, a second color filter CF-Ra, a third color filter CF-Ba, a second division partition wall BMa (or black matrix), and insulating layers 200-1b and 200-2b.

The first division partition wall BWc is disposed on the functional layer 300. The first division partition wall BWc may be formed on the functional layer 300. First to third openings BW-OGb, BW-ORb. and BW-OBb are defined in the first division partition wall BWc. The first light conversion pattern WCGb is disposed in the first opening BW-OGb, the second light conversion pattern WCRb is disposed in the second opening BW-ORb. and the optical pattern OCBb is disposed in the third opening BW-OBb.

Each of the first light conversion patient WCGb, the second light conversion pattern WCRb, and the optical pattern OCBb may be formed by an inkjet process. Compositions are provided in spaces defined by the first division partition wall BWc, for example, the first opening BW-OGb, the second opening BW-ORb. and the third opening BW-OBb to form the first light conversion pattern WCGb, the second light conversion pattern WCRb. and the optical pattern OCBb, respectively.

The first insulating layer 200-1b may be disposed on the first division partition wall BWc, the first light conversion pattern WCGb, the second light conversion pattern WCRb, and the optical pattern OCBb to cover the first division partition wall BWc, the first light conversion pattern WCGb, the second light conversion pattern WCRb. and the optical pattern OCBb.

The first color filter CF-Ga may be disposed on the first insulating layer 200-1b. The first color filter CF-Ga is disposed to correspond to the first pixel area PXA-G. The second color filter CF-Ra may be disposed on the first insulating layer 200-1b. The second color filter CF-Ra is disposed to correspond to the second pixel area PXA-R.

The second division partition wall BMa (or black matrix) is disposed on the peripheral area NPXA. For example, the second division partition wall BMa may be formed after forming the first color filter CF-Ga and the second color filter CF-Ra. The third color filter CF-Ba may cover the second division partition wall BMa and be disposed on the peripheral area NPXA and the third pixel area PXA-B. The third color filter CF-Ba may be a blue color filter.

The second insulating layer 200-2b covering all of the first color filter CF-Ga, the second color filter CF-Ra, and the third color filter CF-Ba is disposed on the first color filter CF-Ga, the second color filter CF-Ra, and the third color filter CF-Ba. The second insulating layer 200-2b may be an organic layer, and an inorganic layer may be further disposed under the second insulating layer 200-2b.

In an embodiment of the inventive concept, a protective substrate may be further disposed on the second insulating layer 200-2b, and the protective substrate may include a synthetic resin substrate or a glass substrate.

The total reflection critical angle between the functional layer 300 and the second inorganic encapsulation layer ITL2 may be less than the reference incident angle AG-LB of the reference light LB. The reference incident angle AG-LB may be an incident angle of the reference light LB incident onto the functional layer 300. The reference light LB may be light incident from the first emission area EA-G toward the second division partition wall BWc.

The display panel according to the embodiment of the inventive concept may include the inorganic encapsulation layer having the first refractive index and the functional layer having the second refractive index less than the first refractive index. The inorganic encapsulation layer and the functional layer may be stacked on the organic encapsulation layer providing the planarized top surface. Therefore, the boundary surface between the inorganic encapsulation layer and the functional layer may be flat inside the display area. The light incident at the angle at which the color mixing occurs may be totally reflected at the boundary between the inorganic encapsulation layer and the functional layer. Therefore, the phenomenon in which the colors are mixed between the adjacent pixel areas may be prevented from occurring. As a result, the display quality of the display panel may be increased. In addition, since the boundary surface between the inorganic encapsulation layer and the functional layer is flat, the design for reducing the color mixing phenomenon may be easier.

While the inventive concept has been described with reference to embodiments thereof, it will be understood by those skilled in the art that various modifications and variations can be made thereto without departing from the spirit and scope of the inventive concept set forth in claims.

What is claimed is:
1. A display panel, comprising:
a first pixel area, a second pixel area, a third pixel area, and a peripheral area that is adjacent to the first, second and third pixel areas;
a base layer;
a circuit layer disposed on the base layer;
an emission layer disposed on the circuit layer and including a first emission area, a second emission area, and a third emission area, wherein each of the first, second and third emission areas generates source light, and wherein the first, second and third emission areas respectively correspond to the first pixel area, the second pixel area, and the third pixel area;
an organic encapsulation layer disposed on the emission layer, wherein a top surface of the organic encapsulation layer is flat;
an inorganic encapsulation layer disposed on the top surface of the organic encapsulation layer and having a first refractive index;
a functional layer disposed on the inorganic encapsulation layer and having a second refractive index less than the first refractive index; and
a partition wall disposed on the functional layer and including a first opening, a second opening, and a third opening, wherein the first, second and third openings respectively correspond to the first pixel area, the second pixel area, and the third pixel area,
wherein a total reflection critical angle between the inorganic encapsulation layer and the functional layer is less than a reference incident angle of reference light traveling from the first emission area toward the partition wall.

2. The display panel of claim I, wherein the reference light is light incident from the first emission area toward a boundary between a first side surface of the partition wall along the first opening and a bottom surface of the partition wall connected to the first side surface.

3. The display panel of claim 2, wherein the reference light is light incident from an outer portion of the first emission area or a central portion of the first emission area toward the boundary.

4. The display panel of claim I, wherein the reference light is light incident from the first emission area toward a boundary between a second side surface of the partition wall along the second opening and a bottom surface of the partition wall connected to the second side surface.

5. The display panel of claim I, wherein the functional layer has a thickness of about 20 angstroms or more.

6. The display panel of claim 1, further comprising:
a first light conversion pattern disposed inside the first opening to convert the source light into first color light;
a second light conversion pattern disposed inside the second opening to convert the source light into second color light; and
an optical pattern disposed inside the third opening, wherein the source light passes through the optical pattern.

7. The display panel of claim 6, further comprising a filling layer which is disposed between the functional layer and the partition wall and including a first surface and a second surface opposite to the first surface,
wherein the first surface is in contact with the functional layer and is flat and the second surface is uneven.

8. The display panel of claim 6, further comprising:
a first color filter disposed on the first light conversion pattern to pass the first color light therethrough;
a second color filter disposed on the second light conversion pattern to pass the second color light therethrough;
a third color filter disposed the optical pattern to pass the source light therethrough; and
a cover layer disposed on the first color filter, the second color filter, and the third color filter.

9. The display panel of claim 1, further comprising:
a first pixel electrode corresponding to the first pixel area;
a second pixel electrode corresponding to the second pixel area; and
a third pixel electrode corresponding to the third pixel area,
wherein the first emission area is a portion of the emission layer overlapping the first pixel electrode, the second emission area is a portion of the emission layer overlapping the second pixel electrode, and the third emission area is a portion of the emission layer overlapping the third pixel electrode.

10. The display panel of claim 1, wherein the partition wall comprises a light blocking material.

11. The display panel of claim 1, wherein the partition wall comprises a first sub partition wall disposed on the functional layer and a second sub partition wall disposed on the first sub partition wall.

12. The display panel of claim 11, wherein each of the first opening, the second opening, and the third opening comprises a first opening portion defined by the first sub partition wall and a second opening portion defined by the second sub partition wall, and wherein the first opening portion has a width greater than that of the second opening portion.

13. The display panel of claim 12, wherein the reference light is light incident from the first emission area toward a boundary between a first side surface defining the first opening portion of the first sub partition wall and a bottom surface of the first sub partition wall connected to the first side surface.

14. The display panel of claim 13, wherein, when viewed in a thickness direction of the display panel, the boundary surrounds one of the first emission area, the second emission area, and the third emission area.

15. The display panel of claim 1, wherein the reference incident angle is given by following equation:

$$\tan^{-1}\left(\frac{DT2}{DT1}\right),$$

where the DT1 is a distance between the emission layer and the functional layer, and
the DT2 is a distance between a first point, at which the reference light is emitted, inside the first emission area and a second point of the functional layer to which the reference light is incident, when viewed in a thickness direction of the display panel,
wherein the first refractive index ($n_1$) and the second refractive index ($n_2$) satisfy the following equation:

$$\sin^{-1}\left(\frac{n_2}{n_1}\right) < \tan^{-1}\left(\frac{DT2}{DT1}\right).$$

16. A display panel, comprising:
a display substrate including a display area, a non-display area, a flat top surface overlapping the display area and an emission layer configured to provide source light;
a functional layer having a second refractive index less than a first refractive index of an uppermost layer of the display substrate forming the flat top surface;
a first light conversion pattern disposed on the functional layer to convert the source light into first color light;
a second light conversion pattern disposed on the functional layer to convert the source light into second color light; and
an optical pattern disposed on the functional layer to transmit the source light therethrough,
wherein a total reflection critical angle between the uppermost layer and the functional layer is less than a reference incident angle of reference light that travels from an area of the emission layer overlapping the first light conversion pattern toward the second light conversion pattern or the optical pattern.

17. The display panel of claim 16, wherein each of top and bottom surfaces of the functional layer overlapping the display area is flat, and
the functional layer has a thickness of about 20 angstroms or more.

18. The display panel of claim 16, further comprising a filling layer disposed on the functional layer and including a first surface contacting the functional layer and a second surface opposite to the first surface,
wherein the first surface is flat, and the second surface is uneven.

19. The display panel of claim 16, further comprising a partition disposed on the funaional layer, the partition including a first opening surrounding the first light conversion pattern, a second opening surrounding the second light conversion pattern, and a third opening surrounding the optical pattern.

20. The display panel of claim 19, wherein the reference light is light incident from the area of the emission layer toward a boundary between a first side surface of the partition configured to define the first opening and a bottom surface of the partition connected to the first side surface, and the reference incident angle is given by the following equation:

$$\tan^{-1}\left(\frac{DT2}{DT1}\right),$$

where the DT1 is a distance between the emission layer and the functional layer, and the DT2 is a distance between a first point, at which the reference light is emitted, inside the first emission area and a second point of the functional layer to which the reference light is incident, when viewed in a thickness direction of the display panel, wherein the first refractive index ($n_1$) and the second refractive index ($n_2$) satisfy the following equation:

$$\sin^{-1}\left(\frac{n_2}{n_1}\right) < \tan^{-1}\left(\frac{DT2}{DT1}\right).$$

* * * * *